(12) United States Patent
Erchak et al.

(10) Patent No.: US 7,915,679 B2
(45) Date of Patent: *Mar. 29, 2011

(54) LIGHT-EMITTING DEVICES INCLUDING A NONPERIODIC PATTERN

(75) Inventors: Alexei A. Erchak, Cambridge, MA (US); Elefterios Lidorikis, Newton, MA (US); Chiyan Luo, Woodside, NY (US)

(73) Assignee: Luminus Devices, Inc., Billerica, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/951,117

(22) Filed: Sep. 27, 2004

(65) Prior Publication Data

US 2005/0051787 A1 Mar. 10, 2005

Related U.S. Application Data

(62) Division of application No. 10/723,987, filed on Nov. 26, 2003, now Pat. No. 7,211,831.

(60) Provisional application No. 60/462,889, filed on Apr. 15, 2003, provisional application No. 60/474,199, filed on May 29, 2003, provisional application No. 60/475,682, filed on Jun. 4, 2003, provisional application No. 60/503,653, filed on Sep. 17, 2003, provisional application No. 60/503,654, filed on Sep. 17, 2003, provisional application No. 60/503,661, filed on Sep. 17, 2003, provisional application No. 60/503,671, filed on Sep. 17, 2003, provisional application No. 60/503,672, filed on Sep. 17, 2003, provisional application No. 60/513,807, filed on Oct. 23, 2003, provisional application No. 60/514,764, filed on Oct. 27, 2003.

(51) Int. Cl.
*H01L 29/02* (2006.01)

(52) U.S. Cl. .................. 257/345; 257/E25.032
(58) Field of Classification Search ............ 257/14, 257/79–103, 345, E25.032
See application file for complete search history.

(56) References Cited

U.S. PATENT DOCUMENTS

| 3,293,513 A | 12/1966 | Biard et al. |
| 3,739,217 A | 6/1973 | Bergh |
| 3,922,706 A | 11/1975 | Kaiser |

(Continued)

FOREIGN PATENT DOCUMENTS

WO 02/41406 5/2002

(Continued)

OTHER PUBLICATIONS

Cahn et al., Quasicrystal, 2002, McGraw-Hill, www.accessscience.com.*

(Continued)

*Primary Examiner* — Bradley K Smith
*Assistant Examiner* — Amar Movva
(74) *Attorney, Agent, or Firm* — Wolf, Greenfield & Sacks, P.C.

(57) ABSTRACT

Light-emitting devices, and related components, systems and methods are disclosed. In some embodiments, the light-emitting devices include a multi-layer stack of materials. The stack of materials includes a light-generating region and a first layer supported by the light-generating region. The surface of the first layer is configured so that light generated by the light-generating region can emerge from the light-emitting device via the surface of the first layer. The surface has a dielectric function that varies spatially according to a nonperiodic pattern.

27 Claims, 16 Drawing Sheets

U.S. PATENT DOCUMENTS

| | | | |
|---|---|---|---|
| 4,864,370 A | 9/1989 | Gaw et al. | |
| 5,073,041 A | 12/1991 | Rastani | |
| 5,126,231 A | 6/1992 | Levy | |
| 5,132,751 A | 7/1992 | Shibata et al. | |
| 5,162,878 A | 11/1992 | Sasagawa et al. | |
| 5,181,220 A | 1/1993 | Yagi | |
| 5,359,345 A | 10/1994 | Hunter et al. | |
| 5,363,009 A | 11/1994 | Monto | |
| 5,376,580 A | 12/1994 | Kish | |
| 5,426,657 A | 6/1995 | Vakhsoori | |
| 5,528,057 A | 6/1996 | Yanagase | |
| 5,600,483 A | 2/1997 | Fan et al. | |
| 5,631,190 A | 5/1997 | Negley et al. | |
| 5,633,527 A | 5/1997 | Lear | |
| 5,724,062 A | 3/1998 | Hunter et al. | |
| 5,779,924 A | 7/1998 | Krames et al. | |
| 5,793,062 A | 8/1998 | Kish et al. | |
| 5,834,331 A | 11/1998 | Razeghi | |
| 5,955,749 A | 9/1999 | Joannopoulos et al. | |
| 6,071,795 A | 6/2000 | Cheung et al. | |
| 6,072,628 A | 6/2000 | Sarayeddine | |
| 6,091,085 A | 7/2000 | Lester | |
| 6,122,103 A | 9/2000 | Perkins et al. | |
| 6,169,294 B1 | 1/2001 | Biing-Jye et al. | 257/79 |
| 6,222,207 B1 | 4/2001 | Carter-Coman et al. | |
| 6,265,820 B1 | 7/2001 | Ghosh et al. | |
| 6,287,882 B1 | 9/2001 | Chang et al. | |
| 6,288,840 B1 | 9/2001 | Perkins et al. | |
| 6,303,405 B1 | 10/2001 | Yoshida et al. | |
| 6,307,218 B1 | 10/2001 | Steigerwald et al. | |
| 6,335,548 B1 | 1/2002 | Roberts et al. | |
| 6,340,824 B1 | 1/2002 | Komoto | |
| 6,380,551 B2* | 4/2002 | Abe et al. | 257/15 |
| 6,388,264 B1 | 5/2002 | Pace | |
| 6,410,348 B1 | 6/2002 | Chen | |
| 6,410,942 B1 | 6/2002 | Thibeault et al. | |
| 6,420,242 B1 | 7/2002 | Cheung et al. | |
| 6,426,515 B2 | 7/2002 | Ishikawa et al. | |
| 6,465,808 B2 | 10/2002 | Lin | |
| 6,468,824 B2 | 10/2002 | Chem | |
| 6,469,324 B1 | 10/2002 | Wang | |
| 6,504,180 B1 | 1/2003 | Heremans et al. | |
| 6,522,063 B2 | 2/2003 | Chen et al. | |
| 6,534,798 B1 | 3/2003 | Scherer et al. | |
| 6,559,075 B1 | 5/2003 | Kelly et al. | |
| 6,573,537 B1 | 6/2003 | Steigerwald et al. | |
| 6,574,383 B1 | 6/2003 | Erchak et al. | |
| 6,593,160 B2 | 7/2003 | Carter-Coman et al. | |
| 6,614,056 B1 | 9/2003 | Tarsa et al. | |
| 6,627,521 B2 | 9/2003 | Furukawa | |
| 6,642,618 B2 | 11/2003 | Yagi et al. | |
| 6,649,437 B1 | 11/2003 | Yang et al. | |
| 6,657,236 B1 | 12/2003 | Thibeault et al. | |
| 6,661,028 B2 | 12/2003 | Chen | |
| 6,690,268 B2 | 2/2004 | Schofield et al. | |
| 6,740,906 B2 | 5/2004 | Slater, Jr. et al. | |
| 6,742,907 B2 | 6/2004 | Funamoto et al. | |
| 6,762,069 B2 | 7/2004 | Huang et al. | |
| 6,777,871 B2 | 8/2004 | Duggal et al. | |
| 6,778,746 B2 | 8/2004 | Charlton et al. | |
| 6,784,027 B2 | 8/2004 | Streubel et al. | |
| 6,784,463 B2 | 8/2004 | Camras et al. | |
| 6,791,117 B2 | 9/2004 | Yoshitake | |
| 6,791,119 B2 | 9/2004 | Slater, Jr. et al. | |
| 6,791,259 B1 | 9/2004 | Stokes | |
| 6,794,684 B2 | 9/2004 | Slater, Jr. et al. | |
| 6,800,500 B2 | 10/2004 | Coman | |
| 6,803,603 B1 | 10/2004 | Nitta et al. | 257/79 |
| 6,812,503 B2 | 11/2004 | Lin | |
| 6,818,531 B1 | 11/2004 | Yoo | |
| 6,825,502 B2 | 11/2004 | Okazaki et al. | |
| 6,828,597 B2 | 12/2004 | Wegleiter | |
| 6,828,724 B2 | 12/2004 | Burroughes | |
| 6,831,302 B2 | 12/2004 | Erchak et al. | |
| 6,847,057 B1 | 1/2005 | Gardner et al. | |
| 6,849,558 B2 | 2/2005 | Schaper | |
| 6,878,969 B2 | 4/2005 | Tanaka | |
| 6,891,203 B2 | 5/2005 | Kozawa | |
| 6,900,587 B2 | 5/2005 | Suehiro | |
| 6,924,136 B2 | 8/2005 | Takada | |
| 6,943,379 B2 | 9/2005 | Suehiro | |
| 6,946,683 B2 | 9/2005 | Sano et al. | |
| 6,958,494 B2 | 10/2005 | Lin | |
| 7,138,666 B2 | 11/2006 | Erchak et al. | |
| 7,211,831 B2 | 5/2007 | Erchak et al. | |
| 7,417,367 B2 | 8/2008 | Erchak | |
| 7,521,854 B2 | 4/2009 | Erchak | |
| 2002/0110172 A1 | 8/2002 | Hasnain et al. | |
| 2003/0017581 A1* | 1/2003 | Li et al. | 435/287.2 |
| 2003/0116767 A1* | 6/2003 | Kneissl et al. | 257/79 |
| 2003/0141507 A1 | 7/2003 | Krames et al. | |
| 2003/0141563 A1 | 7/2003 | Wang | |
| 2003/0143772 A1 | 7/2003 | Chen | |
| 2003/0209714 A1 | 11/2003 | Taskar et al. | |
| 2003/0222263 A1 | 12/2003 | Choi | |
| 2004/0027062 A1 | 2/2004 | Shiang et al. | |
| 2004/0043524 A1 | 3/2004 | Huang et al. | |
| 2004/0110856 A1 | 6/2004 | Young et al. | |
| 2004/0130263 A1 | 7/2004 | Horng | |
| 2004/0144985 A1 | 7/2004 | Zhang et al. | |
| 2004/0182914 A1 | 9/2004 | Venugopalan | |
| 2004/0206962 A1 | 10/2004 | Erchak et al. | |
| 2004/0206971 A1 | 10/2004 | Erchak et al. | |
| 2004/0207310 A1 | 10/2004 | Erchak et al. | |
| 2004/0207319 A1 | 10/2004 | Erchak et al. | |
| 2004/0207320 A1 | 10/2004 | Erchak | |
| 2004/0207323 A1 | 10/2004 | Erchak et al. | |
| 2004/0259279 A1 | 12/2004 | Erchak et al. | |
| 2004/0259285 A1 | 12/2004 | Erchak et al. | |
| 2005/0019971 A1 | 1/2005 | Slater, Jr. | |
| 2005/0040424 A1 | 2/2005 | Erchak et al. | |
| 2005/0051785 A1 | 3/2005 | Erchak et al. | |
| 2005/0051787 A1 | 3/2005 | Erchak et al. | |
| 2005/0059178 A1 | 3/2005 | Erchak et al. | |
| 2005/0059179 A1 | 3/2005 | Erchak et al. | |
| 2005/0082545 A1 | 4/2005 | Wierer | |
| 2005/0087754 A1* | 4/2005 | Erchak | 257/98 |
| 2005/0087757 A1 | 4/2005 | Erchak et al. | |
| 2005/0112886 A1 | 5/2005 | Asakawa | |
| 2005/0127375 A1 | 6/2005 | Erchak et al. | |
| 2005/0145864 A1 | 7/2005 | Sugiyama et al. | |
| 2005/0145877 A1 | 7/2005 | Erchak | |
| 2005/0167687 A1 | 8/2005 | Erchak | |
| 2005/0205883 A1 | 9/2005 | Wierer | |
| 2005/0211994 A1 | 9/2005 | Erchak | |

FOREIGN PATENT DOCUMENTS

| | | |
|---|---|---|
| WO | 02/089221 | 7/2002 |
| WO | 02/071450 A2 | 9/2002 |
| WO | 2005/004231 | 1/2005 |

OTHER PUBLICATIONS

Two-Dimensional Penrose-Tiled Photonic Quasicrystals: From Diffraction Pattern to Band Structure, 2000, Nanotechnology 11, pp. 274-280.*

Quasicrystals and Geometry, Charles Radin, 1996, Notices of the AMS, vol. 43 No. 4, pp. 416-421.*

Wendt et al. "Nanofabrication of photonic lattice structures in GaAs/AlGaAs," J. Vac. Sci. Technol. B 11 (6), Nov./Dec. 1993, pp. 2637-2640.

Gourley et al. "Optical properties of two-dimensional photonic lattices fabricated as honeycomb nanostructures in compound semiconductors," Appl. Phys. Lett. 64 (6), Feb. 7, 1994, pp. 687-689.

W.S. Wong et al. "Damage-free separation of GaN thin films from sapphire substrates", Appl. Phys. Lett. 72 (5), Feb. 2, 1998, pp. 599-601.

M.K. Kelly et al. "Optical process for liftoff of Group III-nitride films", Physica Status Solidi; Rapid Research Note, Nov. 28, 1996, 2 pages.

A. A. Erchak et al. "Enhanced coupling to vertical radiation using a two-dimensional photonic crystal in a semiconductor light-emitting diode", Appl. Phys. Lett. (78 (5), Jan. 29, 2001, pp. 563-565.

P.L. Gourley et al. "Optical properties of two-dimensional photonic lattices fabricated as honeycomb nanostructures in compound semiconductors", Appl. Phys. Lett. 64(6), Feb. 7, 1994, pp. 687-689.

P.L. Gourley et al. "Optical Bloch waves in a semiconductor photonic lattice", Appl. Phys. Lett. 60 (22), Jun. 1, 1992, pp. 2714-2716.

J.R. Wendt et al. "Nanofabrication of photonic lattice structures in GaAs/AlGaAs", J.Vac. Sci. Technol. B 11(6), Nov./Dec. 1993, pp. 2637-2640.

M. Krames et al "Introduction to the Issue on High-Efficiency Light-Emitting Diodes", IEEE Journal on selected topic in quantum electronics, vol. 8, No. 2 Mar./Apr. 2002, pp. 185-188.

K. Streubel et al.. "High Brightness AlGaInP Light-Emitting Diodes", IEEE Journal on selected topic in quantum electronics, vol. 8, No. 2, Mar./Apr. 2002, pp. 321-332.

M. Okai et al. "Novel method to fabricate corrugation for a $\lambda/4$-shifted distributed feedback laser using a granting photomask", Appl. Phys. Lett. 55(5), Jul. 31, 1989, pp. 415-417.

T.L. Koch et al. "1.55-$\mu$ InGaAsP distributed feedback vapor phase transported buried heterostructure lasers", Appl. Phys. Lett. 47 (1), Jul. 1, 1985, pp. 12-14.

W.T. Tsang et al. "Semiconductor distributed feedback lasers with quantum well or superlattice grating for index or gain-coupled optical feedback", Appl. Phys. Lett. 60 (21), May 25, 1992, pp. 258-2582.

M. Zelsmann et al. "Seventy-fold enhancement of light extraction from a defectless photonic crystal made on silicon-on-insulator", Appl. Phys. Lett. 83 (13), Sep. 29, 2003, pp. 2542-2544.

M. Rattier et al. "Omnidirectional and compact guided light extraction from Archimedean photonic lattices", Appl. Phys. Lett. 83 (7), Aug. 18, 2003, pp. 1283-1285.

Y.-J. Lee et al., "A high-extraction-efficiency nanopatterned organic light-emitting diode", Appl. Phys. Lett. 82(21), May 26, 2003, pp. 3779-3781.

I. Schnitzer et al. "30% external quantum efficiency from surface textured, thin-film light-emitting diodes", Appl. Phys. Lett. 63 (18), Oct. 18, 1993, pp. 2174-2176.

M. Boroditsky et al. "Light extraction from optically pumped light-emitting diode by thin-slab photonic crystals", Appl. Phys. Lett. 75 (8), Aug. 23, 1999, pp. 1036-1038.

L. Chen et al. "Fabrication of 50-100 nm Patterned InGaN Blue Light Emitting Heterostructures", Phys. Stat. Sol. (a), 188 (1), 2001, pp. 135-138.

I. Bulu et al. "Highly directive radiation from sources embedded inside photonic crystals", Appl. Phys. Lett. 83 (16), Oct. 20, 2003, pp. 3263-3265.

T. N. Oder et al. "III-nitride photonic crystals", Appl. Phys. Lett. 83 (6), Aug. 11, 2003, pp. 1231-1233.

M.K. Kelly et al. "Optical patterning of GaN films", Appl. Phys. Lett 68 (12), Sep. 16, 1996, pp. 1749-1751.

A. Köck et al., "Novel surface emitting GaAs/AlGaAs laser diodes based on surface mode emission," Appl. Phys. Lett. 63 (9), Aug. 30, 1993, pp. 1164-1166.

A. Köck et al., "Strongly directional emission from AlGaAs/GaAs light-emitting diodes," Appl. Phys. Lett. 57 (22), Nov. 26, 1990, pp. 2327-2329.

* cited by examiner

LIGHT-EMITTING DEVICES INCLUDING A NONPERIODIC PATTERN

CROSS-REFERENCE TO RELATED APPLICATIONS

This application is a divisional application of and claims priority under 35 U.S.C. §120 to application Ser. No. 10/723,987, filed Nov. 26, 2003, now U.S. Pat. No. 7,211,831 which claims priority under 35 U.S.C. §119 to the following U.S. Provisional Patent Applications: 60/462,889, filed Apr. 15, 2003; 60/474,199, filed May 29, 2003; 60/475,682, filed Jun. 4, 2003; 60/503,653, filed Sep. 17, 2003; 60/503,654 filed Sep. 17, 2003; 60/503,661, filed Sep. 17, 2003; 60/503,671, filed Sep. 17, 2003; 60/503,672, filed Sep. 17, 2003; 60/513,807, filed Oct. 23, 2003; and 60/514,764, filed Oct. 27, 2003. Each of these applications is incorporated herein by reference.

TECHNICAL FIELD

The invention relates to light-emitting devices, and related components, systems and methods.

BACKGROUND

A light emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

A common approach to preparing an LED is as follows. The layers of material are prepared in the form of a wafer. Typically, the layers are formed using an epitaxial deposition technique, such as metal-organic chemical vapor deposition (MOCVD), with the initially deposited layer being formed on a growth substrate. The layers are then exposed to various etching and metallization techniques to form contacts for electrical current injection, and the wafer is subsequently sectioned into individual LED chips. Usually, the LED chips are packaged.

During use, electrical energy is usually injected into an LED and then converted into electromagnetic radiation (light), some of which is extracted from the LED.

SUMMARY

The invention relates to light-emitting devices, and related components, systems and methods.

In one embodiment, the invention features a light-emitting device that includes a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer. The surface of the first layer has a dielectric function that varies spatially according to a pattern, and the pattern has an ideal lattice constant and a detuning parameter with a value greater than zero.

In another embodiment, the invention features a light-emitting device that includes a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer, and the surface has a dielectric function that varies spatially according to a nonperiodic pattern.

In a further embodiment, the invention features a light-emitting device that includes a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer, and the surface has a dielectric function that varies spatially according to a complex periodic pattern.

In one embodiment, the invention features a light-emitting device that includes a multi-layer stack of materials. The multi-layer stack of materials includes a layer of n-doped material, a layer of p-doped material, and a light-generating region. The light-emitting device also includes a layer of reflective material that is capable of reflecting at least about 50% of light generated by the light-generating region that impinges on the layer of reflective material. The surface of the layer of n-doped material is configured so that light generated by the light-generating region can emerge from the light-emitting device via the surface of the layer of n-doped material. The surface of the layer of n-doped material has a dielectric function that varies spatially according to a pattern, and the distance between the layer of p-doped material and the layer of reflective material is less than the distance between the layer of n-doped material and the layer of reflective material.

In another embodiment, the invention features a light-emitting device that includes a multi-layer stack of materials including a light-generating region and a first layer supported by the light-generating region. The surface of the first layer is configured so that light generated by the light-generating region can emerge from the light-emitting device via the surface of the first layer, and the surface of the first layer has a dielectric function that varies spatially according to a pattern. The light-emitting device also includes a layer of reflective material that is capable of reflecting at least about 50% of light generated by the light-generating region that impinges on the layer of reflective material. The light-generating region is between the layer of reflective material and the first layer, and the pattern does not extend beyond the first layer.

In a further embodiment, the invention features a light-emitting device that includes a multi-layer stack of materials. The multi-layer stack of materials includes a light-generating region, and a first layer supported by the light-generating region. The surface of the first layer is configured so that light generated by the light-generating region can emerge from the light-emitting device via the surface of the first layer. The light-emitting device also includes a material in contact with the surface of the first layer, where the material has an index of refraction less than about 1.5. The light emitting device is packaged.

In one embodiment, the invention features a light-emitting device that includes a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer. The surface of the first layer has a dielectric function that varies spatially according to a pattern. The light-emitting device also includes a phosphor material supported by the surface of the first layer. The sidewalls of the light-emitting device are substantially devoid of the phosphor material.

In another embodiment, the invention features a method of making a wafer. The method includes disposing a phosphor material on a surface of the wafer. The wafer includes a plurality of light-emitting devices. Each light-emitting device includes a multi-layer stack of materials including a light-generating region and a first layer supported by the light-generating region. The surface of the first layer is configured so that light generated by the light-generating region can emerge from the light-emitting device via the surface of the first layer, and the surface of the first layer has a dielectric function that varies spatially according to a pattern.

In a further embodiment, the invention features a light-emitting device that includes a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer, and the surface of the first layer has a dielectric function that varies spatially according to a pattern. The light-emitting device also includes a phosphor material configured so that light generated by the light-generating region that emerges via the surface of the first layer interacts with the phosphor material so that light that emerges from the phosphor layer is substantially white light. The ratio of the height of the light-emitting device to an area of the light-emitting device is sufficiently small enough for the white light to extend in all directions.

In one embodiment, the invention features a light-emitting device that includes a multi-layer stack of materials. The multi-layer stack of materials includes a light-generating region, and a first layer supported by the light-generating region. The surface of the first layer is configured so that light generated by the light-generating region can emerge from the light-emitting device via the surface of the first layer. The light-emitting device also includes a first sheet formed of a material that is substantially transparent to light that emerges from the light-emitting device, and a second sheet that includes a phosphor material. The second sheet is adjacent the first sheet. The light-emitting device is packaged, and the first and second sheets form a portion of the package for the light-emitting device.

In another embodiment, the invention features a light-emitting device that includes a multi-layer stack of materials including a light-generating region and a first layer supported by the light-generating region. The surface of the first layer is configured so that light generated by the light-generating region can emerge from the light-emitting device via the surface of the first layer. The surface of the first layer has a dielectric function that varies spatially according to a pattern, and the pattern is configured so that light generated by the light-generating region that emerges from the light-emitting device via the surface of the first layer is more collimated than a lambertian distribution of light.

In a further embodiment, the invention features a wafer that includes a plurality of light-emitting devices. At least some of the light-emitting devices include a multi-layer stack of materials. The multi-layer stack of materials includes a light-generating region and a first layer supported by the light-generating region. The surface of the first layer is configured so that light generated by the light-generating region can emerge from the light-emitting device via the surface of the first layer. The surface of the first layer has a dielectric function that varies spatially according to a pattern, and the pattern is configured so that light generated by the light-generating region that emerges from the light-emitting device via the surface of the first layer is more collimated than a lambertian distribution of light. The wafer has at least about five (e.g., at least about 25, at least about 50) light-emitting devices per square centimeter.

In one embodiment, the invention features a light-emitting device that includes a multi-layer stack of materials. The multi-layer stack of materials includes a light-generating region and a first layer supported by the light-generating region so that, during use of the light-emitting device, light generated by the light-generating region can emerge from the light-emitting device via a surface of the first layer. The surface of the first layer has a dielectric function that varies spatially according to a pattern, and at least about 45% (e.g., at least about 50%, at least about 60%, at least about 70%) of the total amount of light generated by the light-generating region that emerges from the light-emitting device emerges via the surface of the light-emitting device.

In another embodiment, the invention features a light-emitting device that includes a multi-layer stack of materials. The multi-layer stack of materials includes a light-generating region and a first layer supported by the light-generating region so that, during use of the light-emitting device, light generated by the light-generating region can emerge from the light-emitting device via a surface of the first layer. The light-emitting device has an edge which is at least about one millimeter (e.g., at least about 1.5 millimeters, at least about tow millimeters, at least about 2.5 millimeters) long, and the light-emitting device is designed so that the extraction efficiency of the light-emitting device is substantially independent of the length of the edge of the length of the edge.

In a further embodiment, the invention features a light-emitting device that includes a multi-layer stack of materials. The multi-layer stack of materials includes a light-generating region and a first layer supported by the light-generating region so that, during use of the light-emitting device, light generated by the light-generating region can emerge from the light-emitting device via a surface of the first layer. The light-emitting device has an edge which is at least about one millimeter (e.g., at least about 1.5 millimeters, at least about tow millimeters, at least about 2.5 millimeters) long, and the light-emitting device is designed so that the quantum efficiency of the light-emitting device is substantially independent of the length of the edge of the length of the edge.

In one embodiment, the invention features a light-emitting device that includes a multi-layer stack of materials. The multi-layer stack of materials includes a light-generating region and a first layer supported by the light-generating region so that, during use of the light-emitting device, light generated by the light-generating region can emerge from the light-emitting device via a surface of the first layer. The light-emitting device has an edge which is at least about one millimeter (e.g., at least about 1.5 millimeters, at least about tow millimeters, at least about 2.5 millimeters) long, and the light-emitting device is designed so that the wall plug efficiency of the light-emitting device is substantially independent of the length of the edge of the length of the edge.

In another embodiment, the invention features a method of making a light-emitting device. The method includes bonding a layer of a reflective material with a layer of p-doped material. The light-emitting device includes a multi-layer stack of materials including the layer of p-doped material, a light-generating region, and a first layer. The first layer includes a surface having a dielectric function that varies spatially according to a pattern, and the reflective material is capable of reflecting at least about 50% of light generated by the light-generating region that impinges on the layer of reflective material.

In a further embodiment, the invention features a method of making a light-emitting device. The method includes disbonding a substrate bonded with a first layer. The first layer forms a portion of a multi-layer stack of materials that includes a light-generating region, and the method forms a light-emitting device in which a surface of the first layer has a surface with a dielectric function that varies spatially according to a pattern.

Embodiments can feature one or more of the following aspects.

The multi-layer stack of materials can be formed of a multi-layer stack of semiconductor materials. The first layer can be a layer of n-doped semiconductor material, and the multi-layer stack can further include a layer of p-doped semiconductor material. The light-generating region can be between the layer of n-doped semiconductor material and the layer of p-doped semiconductor material.

The light-emitting device can further include a support that supports the multi-layer stack of materials.

The light-emitting device can further include a layer of reflective material that is capable of reflecting at least about 50% of light generated by the light-generating region that impinges on the layer of reflective material. The layer of reflective material can be between the support and the multi-layer stack of materials. The distance between the layer of p-doped semiconductor material and the layer of reflective material can be less than a distance between the layer of n-doped semiconductor material and the layer of reflective material. The light-emitting device can further include a p-ohmic contact layer between the layer of p-doped material and the layer of reflective material.

The light-emitting device can further include a current-spreading layer between the first layer and the light-generating region.

The multi-layer stack of materials can be formed of semiconductor materials, such as, for example, III-V semiconductor materials, organic semiconductor materials and/or silicon.

In some embodiments, the pattern does not extend into the light-generating region.

In certain embodiments, the pattern does not extend beyond the first layer.

In some embodiments, the pattern extends beyond the first layer.

The light-emitting device can further include electrical contacts configured to inject current into the light-emitting device. The electrical contacts can be configured to vertically inject electrical current into the light-emitting device.

The pattern can be partially formed of a component selected from, for example, holes in the surface of the first layer, pillars in the first layer, continuous veins in the first layer, discontinuous veins in the first layer and combinations thereof.

In some embodiments, the pattern can be selected from triangular patterns, square patterns, and grating patterns.

In certain embodiments, the pattern can be selected from aperiodic patterns, quasicrystalline patterns, Robinson patterns, and Amman patterns. In some embodiments, the pattern is a Penrose pattern.

In some embodiments, the pattern is selected from honeycomb patterns and Archimidean patterns. In certain embodiments, a pattern (e.g., a honeycomb pattern) can have holes with different diameters.

The pattern can be partially formed of holes in the surface of the first layer.

The detuning parameter can be, for example, at least about 1% of the ideal lattice constant and/or at most about 25% of the ideal lattice constant. In some embodiments, the pattern can correspond to a substantially randomly detuned ideal pattern.

The pattern can be configured so that light emitted by the surface of the first layer has a spectrum of radiation modes, and the spectrum of radiation modes is substantially the same as a characteristic emission spectrum of the light-generating region.

The light-emitting device can be, for example, a light-emitting diode, a laser, or an optical amplifier. Examples of light-emitting devices include organic light-emitting devices (OLEDs), flat surface-emitting LEDs, and high brightness light-emitting devices (HBLEDs).

In some embodiments, the surface of the first layer has features with a size of less than about $\lambda/5$, where $\lambda$ is a wavelength of light that can be emitted by the first layer.

In certain embodiments, the light-emitting device is packaged (e.g., in the form of a packaged die). In some embodiments, a packaged light-emitting device can be free of an encapsulant material.

In some embodiments, the material in contact with the surface of the first layer is a gas (e.g., air). The gas can have a pressure of less than about 100 Torr.

In certain embodiments, the material in contact with the surface of the first layer has an index of refraction of at least about one.

In some embodiments, a packaged LED includes a cover. The cover can include a phosphor material. The cover can be configured so that light generated by the light-generating region that emerges via the surface of the first layer can interact with the phosphor material, and so that light that emerges via the surface of the first layer and interacts with the phosphor material emerges from the cover as substantially white light.

In certain embodiments, the light-emitting device further includes a first sheet comprising a material that is substantially transparent to light that emerges from the light-emitting device, and a second sheet that includes a phosphor material. The second sheet can be adjacent the first sheet, and a material having an index of refraction of less than about 1.5 can be between the first sheet and the surface of the first layer. The first and second sheets can be configured so that light generated by the light-generating region that emerges via the surface of the first layer can interact with the phosphor material, and so that light that emerges via the surface of the first layer and interacts with the phosphor material emerges from the second sheet as substantially white light.

The phosphor material can be disposed on the surface of the first layer.

Methods of making a wafer can include disposing the phosphor material to form of a layer having a thickness that varies by less than about 20%. The methods can include flattening the layer of the phosphor material so that a thickness of the layer of the phosphor material varies by less than about 20%. The methods can also include flattening the phosphor material after disposing the phosphor material on the surface of the first layer. The phosphor material can be, for example, spin-coated on the surface of the wafer. The methods can include forming a plurality of the light emitting devices from the wafer, and separating at least some of the light-emitting devices from each other.

In some embodiments, when light generated by the light-generating region emerges from the light-emitting device via the surface of the first layer, at least about 40% of the light emerging via the surface of the first layer emerges within at most about 30° of an angle normal to the surface of the first layer.

In certain embodiments, the filling factor of the light-emitting device is at least about 10% and/or at most about 75%.

Methods of making a light-emitting device can further include, before bonding the layer of the reflective material with the layer of p-doped material, bonding the first layer with a substrate, the multi-layer stack of materials being between the substrate and the layer of reflective material. The methods can also include forming a bonding layer between the first layer and the substrate. The methods can also include removing the substrate. The methods can further include lapping and polishing steps after removing the substrate. The substrate can be removed after bonding the layer of the reflective material with the first layer. Removing the substrate can include heating a bonding layer disposed between the first layer and the substrate. Heating the bonding layer can decompose at least a portion of the bonding layer. Heating the bonding layer can include exposing the bonding layer to radiation emitted by a laser. Removing the substrate can include exposing the substrate using a laser liftoff process. Removing the substrate can result in the surface of the first layer becoming substantially flat. The methods can further include, before forming the pattern in the surface of the first layer, planarizing the surface of the first layer after the first substrate is removed. Planarizing the surface of the first layer can include chemical-mechanical polishing the surface of the first layer. Planarizing the surface of the first layer can reduce the roughness of the surface of the first layer to greater than about $\lambda/5$, where $\lambda$ is a wavelength of light that can be emitted by the first layer. Forming the pattern can include using nanolithography. The methods can also include disposing a substrate on the layer of reflective material. The methods can further include disposing a current-spreading layer between the first layer and the light-generating region.

Embodiments can feature one or more of the following advantages.

In certain embodiments, an LED and/or a relatively large LED chip can exhibit relatively high light extraction.

In some embodiments, an LED and/or a relatively large LED chip can exhibit relatively high surface brightness, relatively high average surface brightness, relatively low need for heat dissipation or relatively high rate of heat dissipation, relatively low etendue and/or relatively high power efficiency.

In certain embodiments, an LED and/or a relatively large LED chip can be designed so that relatively little light emitted by the LED/LED chip is absorbed by packaging.

In some embodiments, a packaged LED (e.g., a relatively large packaged LED) can be prepared without using an encapsulant material. This can result in a packaged LED that avoids certain problems associated with the use of certain encapsulant materials, such as reduced performance and/or inconsistent performance as a function of time, thereby providing a packaged LED that can exhibit relatively good and/or reliable performance over a relatively long period of time.

In certain embodiments, an LED (e.g., a packaged LED, which can be a relatively large packaged LED) can include a relatively uniform coating of a phosphor material.

In some embodiments, an LED (e.g., a packaged LED, which can be a relatively large packaged LED) can be designed to provide a desired light output within a particular angular range (e.g., within a particular angular range relative to the LED surface normal).

In some embodiments, an LED and/or a relatively large LED chip can be prepared by a process that is relatively inexpensive.

In certain embodiments, an LED and/or a relatively large LED chip can be prepared by a process that can be conducted on a commercial scale without incurring costs that render the process economically unfeasible.

Features and advantages of the invention are in the description, drawings and claims.

DESCRIPTION OF DRAWINGS

Like reference symbols in the various drawings indicate like elements.

DETAILED DESCRIPTION

Figure 1:
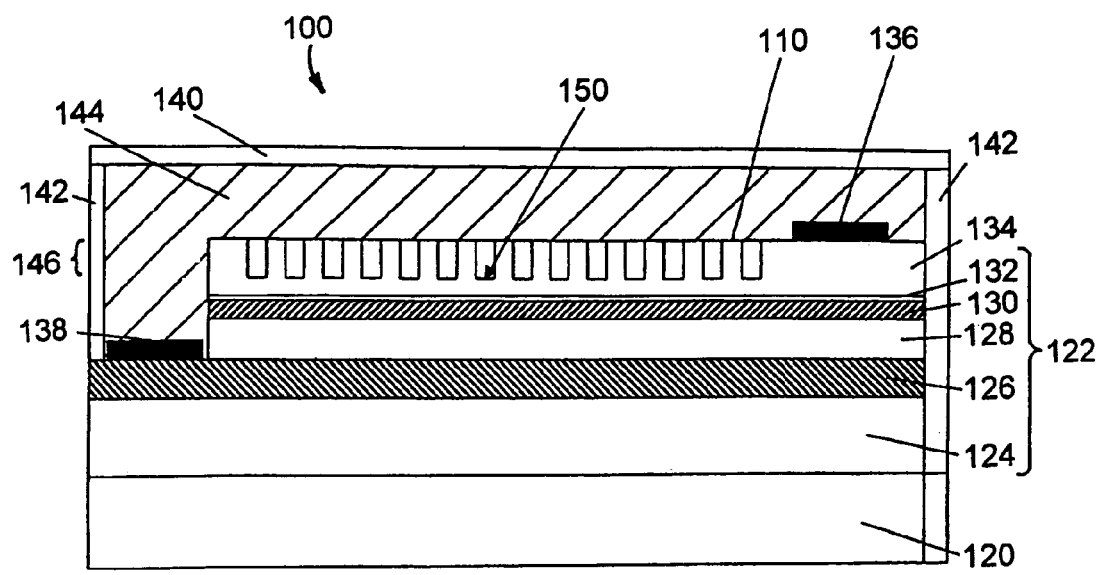
FIG. 1 is a side view of an LED with a patterned surface.

FIG. 1 shows a side view of an LED 100 in the form of a packaged die. LED 100 includes a multi-layer stack 122 disposed on a submount 120. Multi-layer stack 122 includes a 320 nm thick silicon doped (n-doped) GaN layer 134 having a pattern of openings 150 in its upper surface 110. Multi-layer stack 122 also includes a bonding layer 124, a 100 nm thick silver layer 126, a 40 nm thick magnesium doped (p-doped) GaN layer 128, a 120 nm thick light-generating region 130 formed of multiple InGaN/GaN quantum wells, and a AlGaN layer 132. An n-side contact pad 136 is disposed on layer 134, and a p-side contact pad 138 is disposed on layer 126. An encapsulant material (epoxy having an index of refraction of 1.5) 144 is present between layer 134 and a cover slip 140 and supports 142. Layer 144 does not extend into openings 150.

Light is generated by LED 100 as follows. P-side contact pad 138 is held at a positive potential relative to n-side contact pad 136, which causes electrical current to be injected into LED 100. As the electrical current passes through light-generating region 130, electrons from n-doped layer 134 combine in region 130 with holes from p-doped layer 128, which causes region 130 to generate light. Light-generating region 130 contains a multitude of point dipole radiation sources that emit light (e.g., isotropically) within the region 130 with a spectrum of wavelengths characteristic of the material from which light-generating region 130 is formed. For InGaN/GaN quantum wells, the spectrum of wavelengths of light generated by region 130 can have a peak wavelength of about 445 nanometers (nm) and a full width at half maximum (FWHM) of about 30 nm.

It is to be noted that the charge carriers in p-doped layer 126 have relatively low mobility compared to the charge carriers in the n-doped semiconductor layer 134. As a result, placing silver layer 126 (which is conductive) along the surface of p-doped layer 128 can enhance the uniformity of charge injection from contact pad 138 into p-doped layer 128 and light-generating region 130. This can also reduce the electrical resistance of device 100 and/or increase the injection efficiency of device 100. Because of the relatively high charge carrier mobility of the n-doped layer 134, electrons can spread relatively quickly from n-side contact pad 136 throughout layers 132 and 134, so that the current density within the light-generating region 130 is substantially uniform across the region 130. It is also to be noted that silver layer 126 has relatively high thermal conductivity, allowing layer 126 to act as a heat sink for LED 100 (to transfer heat vertically from the multi-layer stack 122 to submount 120).

At least some of the light that is generated by region 130 is directed toward silver layer 126. This light can be reflected by layer 126 and emerge from LED 100 via surface 110, or can be reflected by layer 126 and then absorbed within the semiconductor material in LED 100 to produce an electron-hole pair that can combine in region 130, causing region 130 to generate light. Similarly, at least some of the light that is generated by region 130 is directed toward pad 136. The underside of pad 136 is formed of a material (e.g., a Ti/Al/Ni/Au alloy) that can reflect at least some of the light generated by light-generating region 130. Accordingly, the light that is directed to pad 136 can be reflected by pad 136 and subsequently emerge from LED 100 via surface 110 (e.g., by being reflected from silver layer 126), or the light that is directed to pad 136 can be reflected by pad 136 and then absorbed within the semiconductor material in LED 100 to produce an electron-hole pair that can combine in region 130, causing region 130 to generate light (e.g., with or without being reflected by silver layer 126).

Figure 2:
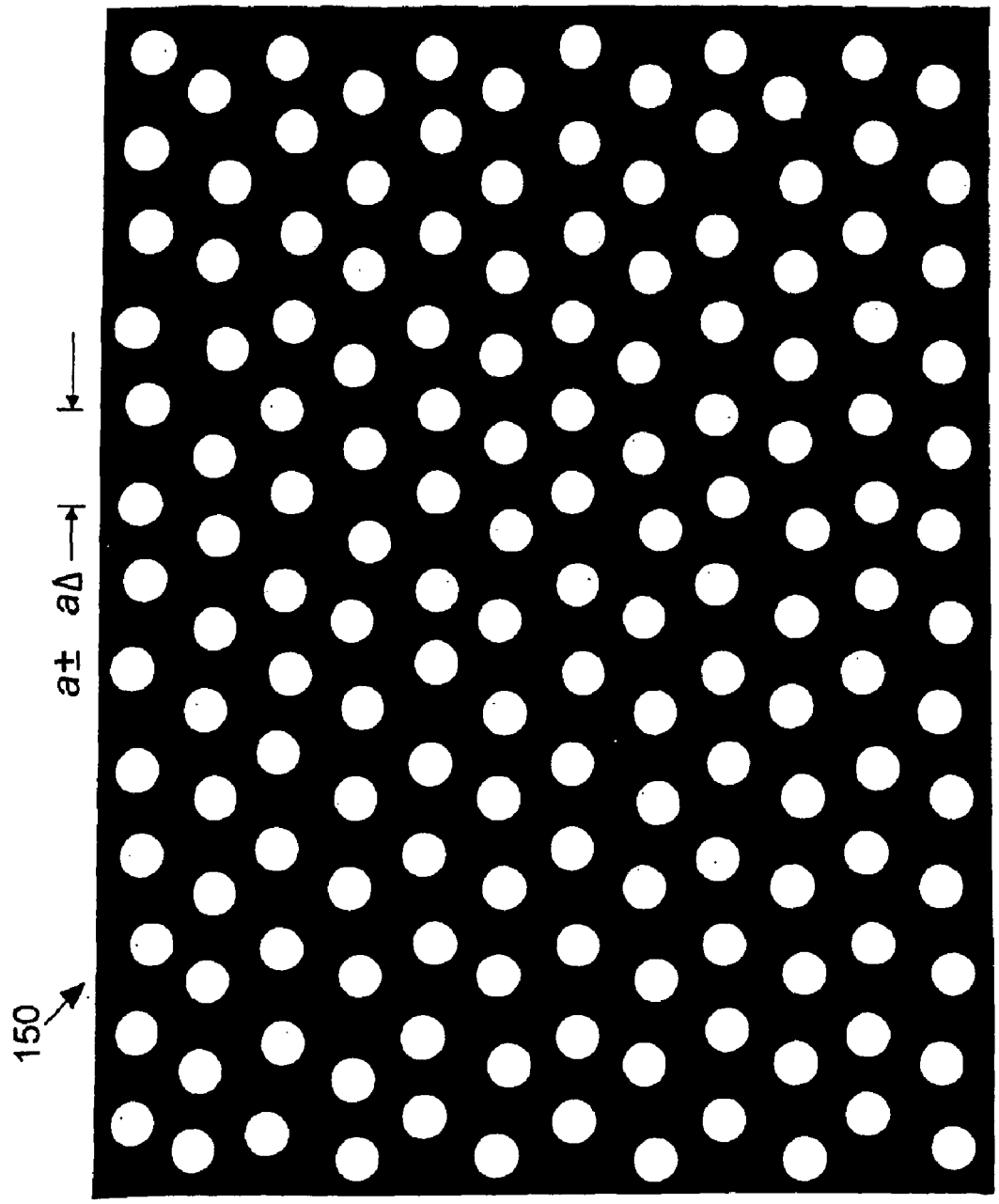
FIG. 2 is a top view the patterned surface of the LED of FIG. 1.

As shown in FIGS. 1 and 2, surface 110 of LED 100 is not flat but consists of a modified triangular pattern of openings 150. In general, various values can be selected for the depth of openings 150, the diameter of openings 150 and the spacing between nearest neighbors in openings 150 can vary. Unless otherwise noted, for purposes of the figures below showing the results of numerical calculations, openings 150 have a depth 146 equal to about 280 nm, a non-zero diameter of about 160 nm, a spacing between nearest neighbors or about 220 nm, and an index of refraction equal to 1.0. The triangular pattern is detuned so that the nearest neighbors in pattern 150 have a center-to-center distance with a value between (a−Δa) and (a+Δa), where "a" is the lattice constant for an ideal triangular pattern and "Δa" is a detuning parameter with dimensions of length and where the detuning can occur in random directions. To enhance light extraction from LED 100 (see discussion below), detuning parameter, Δa, is generally at least about one percent (e.g., at least about two percent, at least about three percent, at least about four percent, at least about five percent) of ideal lattice constant, a, and/or at most about 25% (e.g., at most about 20%, at most about 15%, at most about 10%) of ideal lattice constant, a. In some embodiments, the nearest neighbor spacings vary substantially randomly between (a−Δa) and (a+Δa), such that pattern 150 is substantially randomly detuned.

For the modified triangular pattern of openings 150, it has been found that a non-zero detuning parameter enhances the extraction efficiency of an LED 100. For LED 100 described above, as the detuning parameter Δa increases from zero to about 0.15a, numerical modeling (described below) of the electromagnetic fields in the LED 100 has shown that the extraction efficiency of the device increases from about 0.60 to about 0.70, as shown in FIG. 3.

Figure 3:
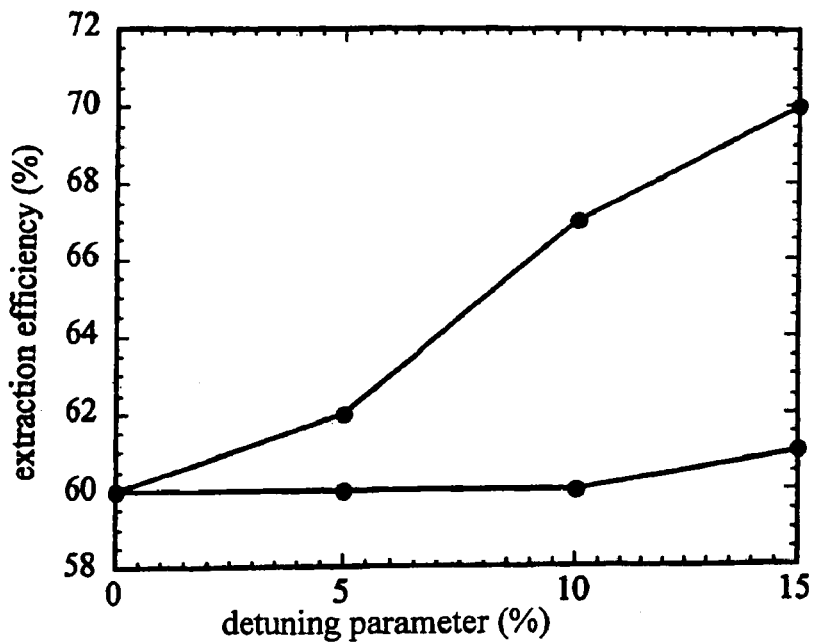
FIG. 3 is a graph of an extraction efficiency of an LED with a patterned surface as function of a detuning parameter.

The extraction efficiency data shown in FIG. 3 are calculated by using a three-dimensional finite-difference time-domain (FDTD) method to approximate solutions to Maxwell's equations for the light within and outside of LED 100. See, for example, K. S. Kunz and R. J. Luebbers, *The Finite-Difference Time-Domain Methods* (CRC, Boca Raton, Fla., 1993); A. Taflove, *Computational Electrodynamics: The Finite-Difference Time-Domain Method* (Artech House, London, 1995), both of which are hereby incorporated by reference. To represent the optical behavior of LED 100 with a particular pattern 150, input parameters in a FDTD calculation include the center frequency and bandwidth of the light emitted by the point dipole radiation sources in light-generating region 130, the dimensions and dielectric properties of the layers within multilayer stack 122, and the diameters, depths, and nearest neighbor distances (NND) between openings in pattern 150.

In certain embodiments, extraction efficiency data for LED 100 are calculated using an FDTD method as follows. The FDTD method is used to solve the full-vector time-dependent Maxwell's equations:

$$\vec{\nabla} \times \vec{E} = -\mu \frac{\partial \vec{H}}{\partial t}, \vec{\nabla} \times \vec{H} = \varepsilon_\infty \frac{\partial \vec{E}}{\partial t} + \frac{\partial \vec{P}}{\partial t},$$

where the polarizability $\vec{P} = \vec{P}_1 + \vec{P}_2 + \ldots + \vec{P}_m$ captures the frequency-dependent response of the quantum well light-generating region 130, the p-contact layer 126 and other layers within LED 100. The individual $\vec{P}_m$ terms are empirically derived values of different contributions to the overall polarizability of a material (e.g., the polarization response for bound electron oscillations, the polarization response for free electron oscillations). In particular, $$\frac{d^2\vec{P}_m}{dt^2} + \gamma_m \frac{d\vec{P}_m}{dt} + \omega_m^2 \vec{P}_m = \varepsilon(\omega)\vec{E},$$

where the polarization corresponds to a dielectric constant $$\varepsilon(\omega) = \varepsilon_\infty + \sum_m \frac{s_m}{\omega_m^2 - \omega^2 - i\gamma_m \omega}.$$

For purposes of the numerical calculations, the only layers that are considered are encapsulant 144, silver layer 126 and layers between encapsulant 144 and silver layer 126. This approximation is based on the assumption that encapsulant 144 and layer 126 are thick enough so that surrounding layers do not influence the optical performance of LED 100. The relevant structures within LED 100 that are assumed to have a frequency dependent dielectric constant are silver layer 126 and light-generating region 130. The other relevant layers within LED 100 are assumed to not have frequency dependent dielectric constants. It is to be noted that in embodiments in which LED 100 includes additional metal layers between encapsulant 144 and silver layer 126, each of the additional metal layers will have a corresponding frequency dependent dielectric constant. It is also to be noted that silver layer 126 (and any other metal layer in LED 100) has a frequency dependent term for both bound electrons and free electrons, whereas light-generating region 130 has a frequency dependent term for bound electrons but does not have a frequency dependent term for free electrons. In certain embodiments, other terms can be included when modeling the frequency dependence of the dielectric constant. Such terms may include, for example, electron-phonon interactions, atomic polarizations, ionic polarizations and/or molecular polarizations.

The emission of light from the quantum well region of light-generating region 130 is modeled by incorporating a number of randomly-placed, constant-current dipole sources within the light-generating region 130, each emitting short Gaussian pulses of spectral width equal to that of the actual quantum well, each with random initial phase and start-time.

To cope with the pattern of openings 150 in surface 110 of the LED 100, a large supercell in the lateral direction is used, along with periodic boundary conditions. This can assist in simulating relatively large (e.g., greater than 0.01 mm on edge) device sizes. The full evolution equations are solved in time, long after all dipole sources have emitted their energy, until no energy remains in the system. During the simulation, the total energy emitted, the energy flux extracted through top surface 110, and the energy absorbed by the quantum wells and the n-doped layer is monitored. Through Fourier transforms both in time and space, frequency and angle resolved data of the extracted flux are obtained, and therefore an angle- and frequency-resolved extraction efficiency can be calculated. By matching the total energy emitted with the experimentally known luminescence of light-generating region 130, absolute angle-resolved extraction in lumens/per solid angle/per chip area for given electrical input is obtained.

Without wishing to be bound by theory, it is believed that the detuned pattern 150 can enhance the efficiency with which light generated in region 130 emerges from LED 100 via surface 110 because openings 150 create a dielectric function that varies spatially in layer 134 according to pattern 150. It is believed that this alters the density of radiation modes (i.e., light modes that emerge from surface 110) and guided modes (i.e., light modes that are confined within multi-layer stack 122) within LED 100, and that this alteration to the density of radiation modes and guided modes within LED 100 results in some light that would otherwise be emitted into guided modes in the absence of pattern 150 being scattered (e.g., Bragg scattered) into modes that can leak into radiation modes. In certain embodiments, it is believed that pattern 150 (e.g., the pattern discussed above, or one of the patterns discussed below) can eliminate all of the guided modes within LED 100.

It is believed that the effect of detuning of the lattice can be understood by considering Bragg scattering off of a crystal having point scattering sites. For a perfect lattice arranged in lattice planes separated by a distance d, monochromatic light of wavelength λ is scattered through an angle θ according to the Bragg condition, nλ=2d sin θ, where n is an integer that gives the order of the scattering. However, it is believed that for a light source having a spectral bandwidth Δλ/λ and emitting into a solid angle ΔΘ, the Bragg condition can be relaxed by detuning the spacing of between lattice sites by a detuning parameter Δa. It is believed that detuning the lattice increases the scattering effectiveness and angular acceptance of the pattern over the spectral bandwidth and spatial emission profile of the source.

While a modified triangular pattern 150 having a non-zero detuning parameter Δa has been described that can enhance light extraction from LED 100, other patterns can also be used to enhance light extraction from LED 100. When determining whether a given pattern enhances light extraction from LED 100 and/or what pattern of openings may be used to enhance light extraction from LED 100, physical insight may first be used to approximate a basic pattern that can enhance light extraction before conducting such numerical calculations.

Figure 4:
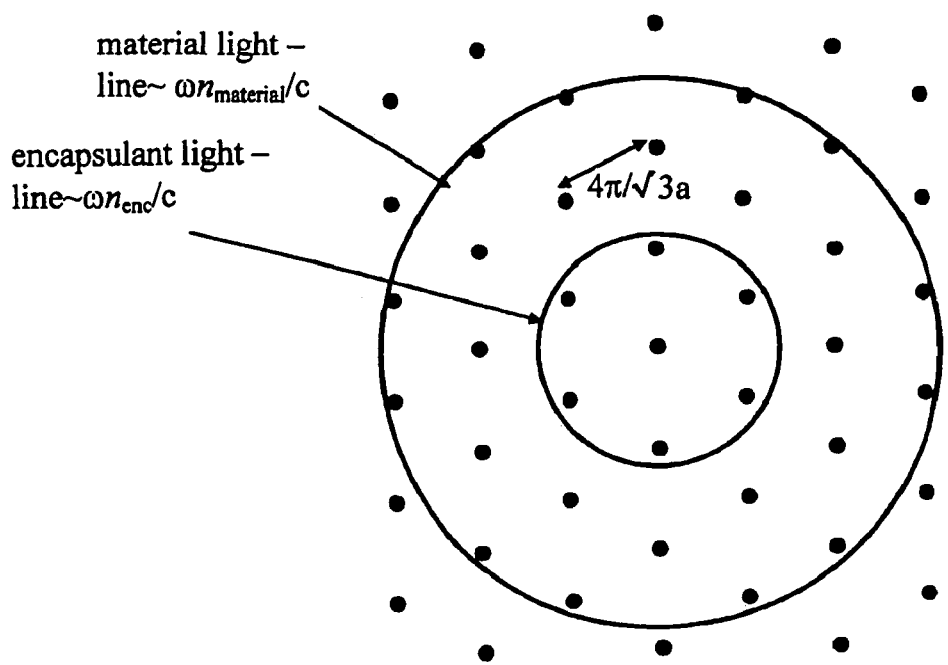
FIG. 4 is a schematic representation of the Fourier transformation of a patterned surface of an LED.

The extraction efficiency of LED 100 can be further understood (e.g., in the weak scattering regime) by considering the Fourier transform of the dielectric function that varies spatially according to pattern 150. FIG. 4 depicts the Fourier transform for an ideal triangular lattice. Extraction of light into a particular direction with in-plane wavevector k is related to the source emission $S_{k'}$ into all those modes with in-plane wavevector k' (i.e. parallel to pattern 150) that are compatible to k by the addition or subtraction of a reciprocal lattice vector G, i.e k=k'±G. The extraction efficiency is proportional to the magnitude of the corresponding Fourier component ($F_k$) of the dielectric function $\varepsilon_G$ given by $$F_{\vec{k}} = c_{\vec{k}} \sum_G \varepsilon_{\vec{G}} S_{\vec{k}-\vec{G}}, \quad \varepsilon_{\vec{G}} = \int \varepsilon(\vec{r}) e^{-i\vec{G}\vec{r}} d\vec{r}$$

Since light propagating in the material generally satisfies the equation $k^2(\text{in-plane}) + k^2(\text{normal}) = \varepsilon(\omega/c)^2$, the maximum G to be considered is fixed by the frequency (ω) emitted by the light-generating region and the dielectric constant of the light-generating region. As shown in FIG. 4, this defines a ring in reciprocal space which is often called the light line. The light line will be an annulus due to the finite bandwidth of the light-generating region but for sake of clarity we illustrate the light line of a monochromatic source. Similarly, light propagating within the encapsulant is bounded by a light line (the inner circle in FIG. 4). Therefore, the extraction efficiency is improved by increasing $F_k$ for all directions k that lie within the encapsulant light-line which amounts to increasing the number of G points within the encapsulant light line and increasing the scattering strength $\varepsilon_G$ for G points which lie within the material light line. This physical insight can be used when selecting patterns that can improve extraction efficiency.

Figure 5:
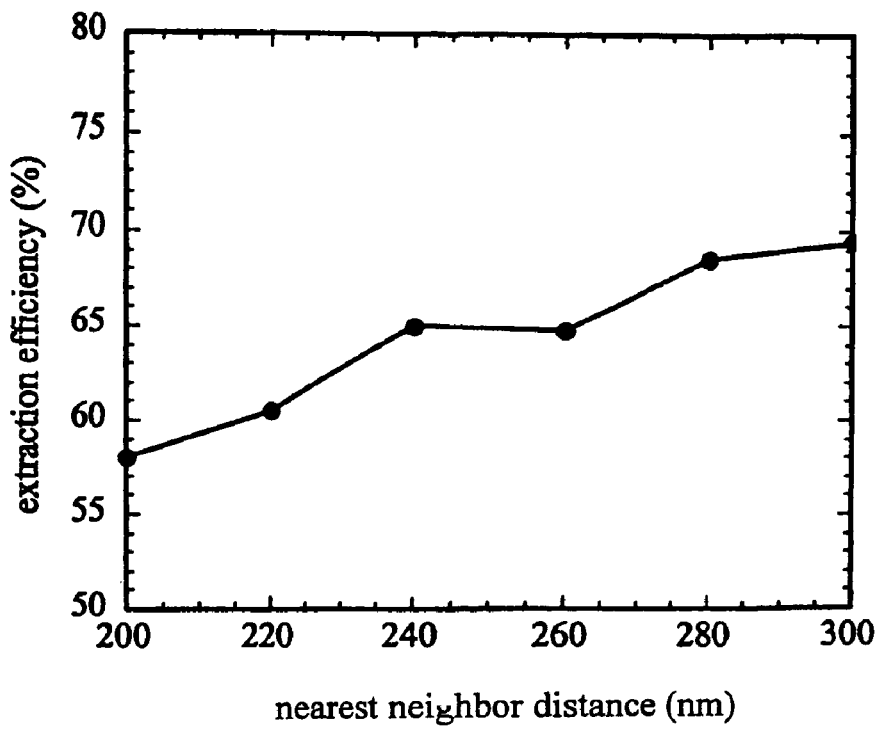
FIG. 5 is a graph of an extraction efficiency of an LED with a patterned surface as function of nearest neighbor distance.

As an example, FIG. 5 shows the effect of increasing lattice constant for an ideal triangular pattern. The data shown in FIG. 5 are calculated using the parameters given for LED 100 shown in FIG. 1, except that the emitted light has a peak wavelength of 450 nm, and the depth of the holes, the diameter of the holes, and the thickness of the n-doped layer 134 scale with the nearest neighbor distance, a, as 1.27a, 0.72a, and 1.27a+40 nm, respectively. Increasing the lattice constant, increases the density of G points within the light-line of the encapsulant. A clear trend in extraction efficiency with NND is observed. It is believed that the maximum extraction efficiency occurs for NND approximately equal to the wavelength of light in vacuum. The reason a maximum is achieved, is that as the NND becomes much larger than the wavelength of light, the scattering effect is reduced because the material becomes more uniform.

Figure 6:
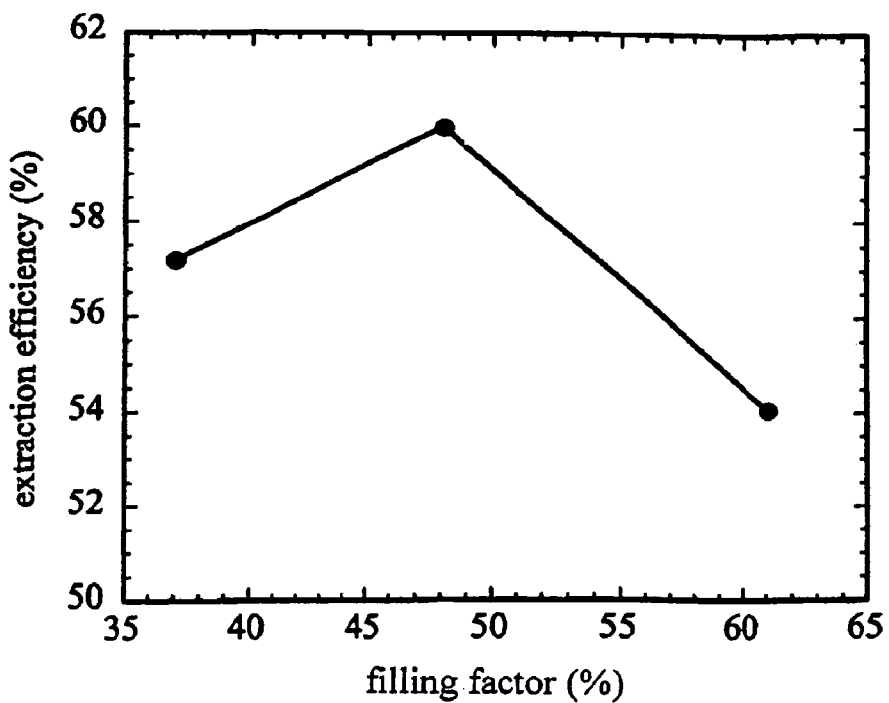
FIG. 6 is a graph of an extraction efficiency of an LED with a patterned surface as function of a filling factor.

As another example, FIG. 6 shows the effect of increasing hole size or filling factor. The filling factor for a triangular pattern is given by $(2\pi/\sqrt{3})*(r/a)^2$, where r is the radius of a hole. The data shown in FIG. 6 are calculated using the parameters given for the LED 100 shown in FIG. 1, except that the diameter of the openings is changed according the filling factor value given on the x-axis of the graph. The extraction efficiency increases with filling factor as the scattering strengths ($\in_G$) increase. A maximum is observed for this particular system at a filling factor of ~48%. In certain embodiments, LED 100 has a filling factor of at least about 10% (e.g., at least about 15%, at least about 20%) and/or at most about 90% (e.g., at most about 80%, at most about 70%, at most about 60%).

Figure 7:
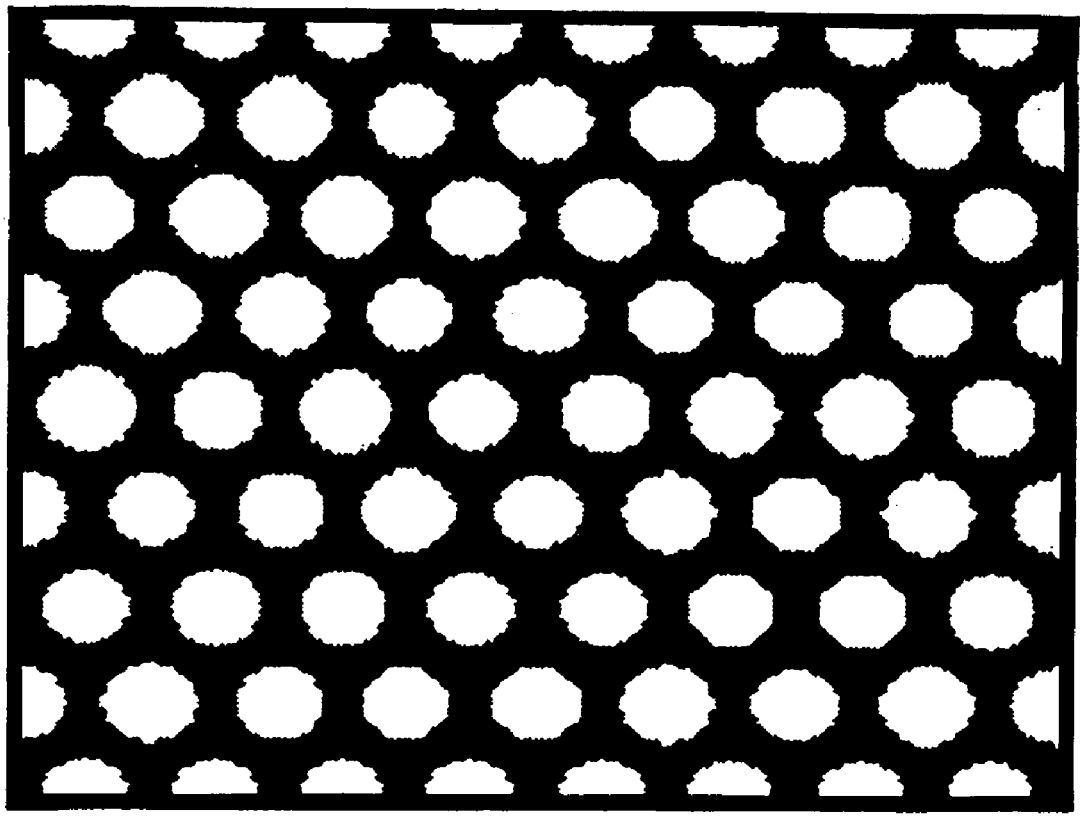
FIG. 7 is a top view a patterned surface of an LED.

While a modified triangular pattern has been described in which a detuning parameter relates to positioning of openings in the pattern from the positions in an ideal triangular lattice, a modified (detuned) triangular pattern may also be achieved by modifying the holes in an ideal triangular pattern while keeping the centers at the positions for an ideal triangular pattern. FIG. 7 shows an embodiment of such a pattern. The enhancement in light extraction, the methodology for conducting the corresponding numerical calculation, and the physical explanation of the enhanced light extraction for a light-emitting device having the pattern shown in FIG. 7 is generally the same as described above. In some embodiments, a modified (detuned) pattern can have openings that are displaced from the ideal locations and openings at the ideal locations but with varying diameters.

In other embodiments, enhanced light extraction from a light-emitting device can be achieved by using different types of patterns, including, for example, complex periodic patterns and nonperiodic patterns. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimidean patterns. As discussed below, in some embodiments, a complex periodic pattern can have certain openings with one diameter and other openings with a smaller diameter. As referred to herein, a nonperiodic pattern is a pattern that has no translational symmetry over a unit cell that has a length that is at least 50 times the peak wavelength of light generated by region 130. Examples of nonperiodic patterns include aperiodic patterns, quasicrystalline patterns, Robinson patterns, and Amman patterns.

Figure 8:
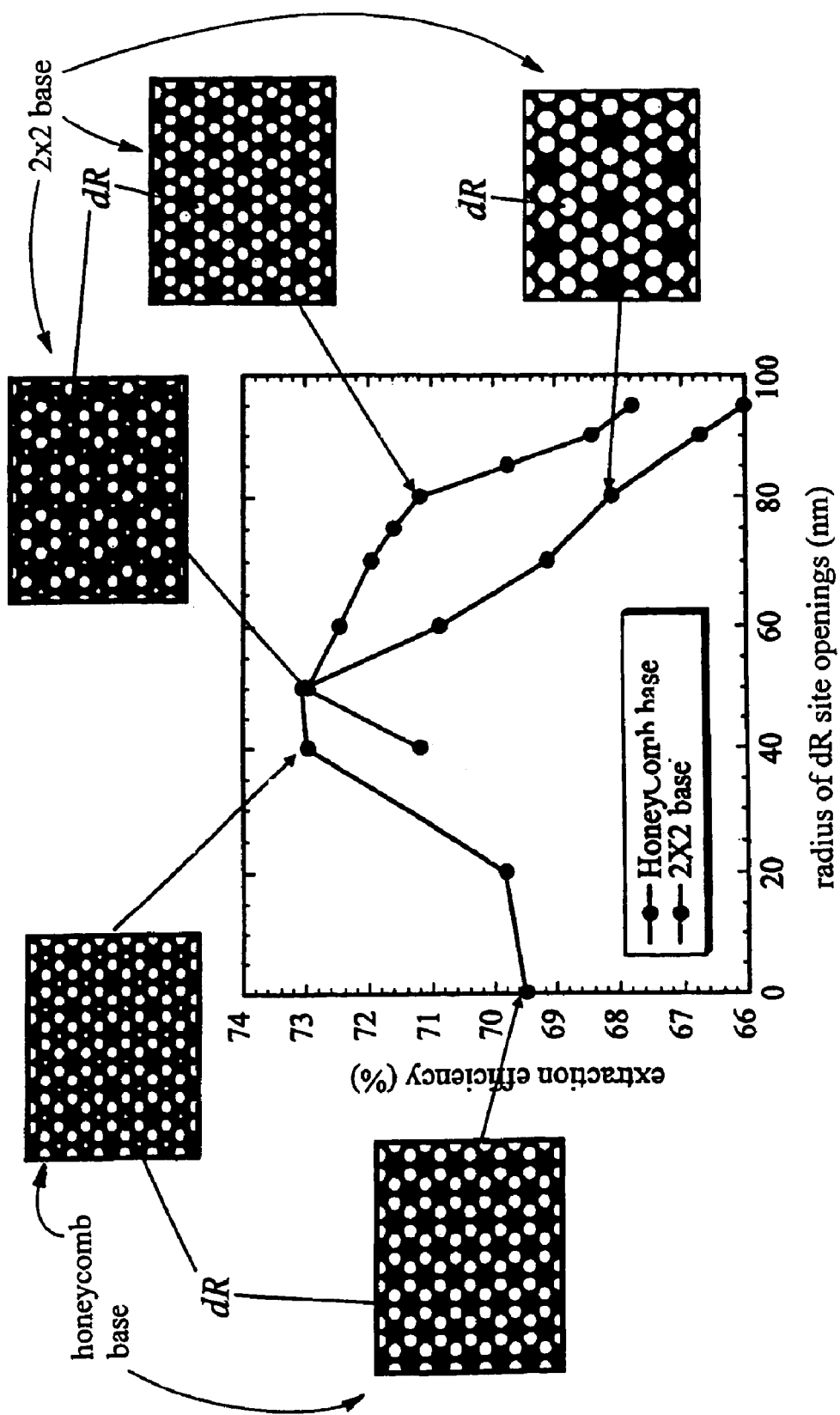
FIG. 8 is a graph of an extraction efficiency of LEDs with different surface patterns.

FIG. 8 shows numerical calculations for LED 100 for two different complex periodic patterns in which certain openings in the patterns have a particular diameter, and other openings in the patterns have smaller diameters. The numerical calculations represented in FIG. 8 show the behavior of the extraction efficiency (larger holes with a diameter of 80 nm) as the diameter of the smaller holes (dR) is varied from zero nm to 95 nm. The data shown in FIG. 6 are calculated using the parameters given for the LED 100 shown in FIG. 1, except that the diameter of the openings is changed according the filling factor value given on the x-axis of the graph. Without wishing to be bound by theory, multiple hole sizes allow scattering from multiple periodicities within the pattern, therefore increasing the angular acceptance and spectral effectiveness of the pattern. The enhancement in light extraction, the methodology for conducting the corresponding numerical calculation, and the physical explanation of the enhanced light extraction for a light-emitting device having the pattern shown in FIG. 8 is generally the same as described above.

Figure 9:
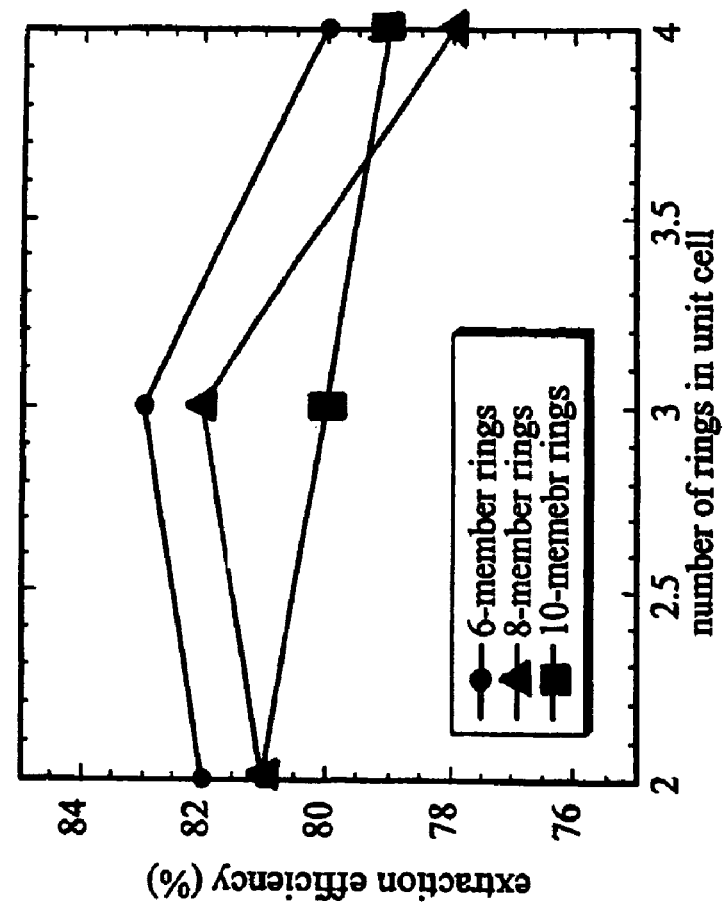
FIG. 9 is a graph of an extraction efficiency of LEDs with different surface patterns.
Figure 9:
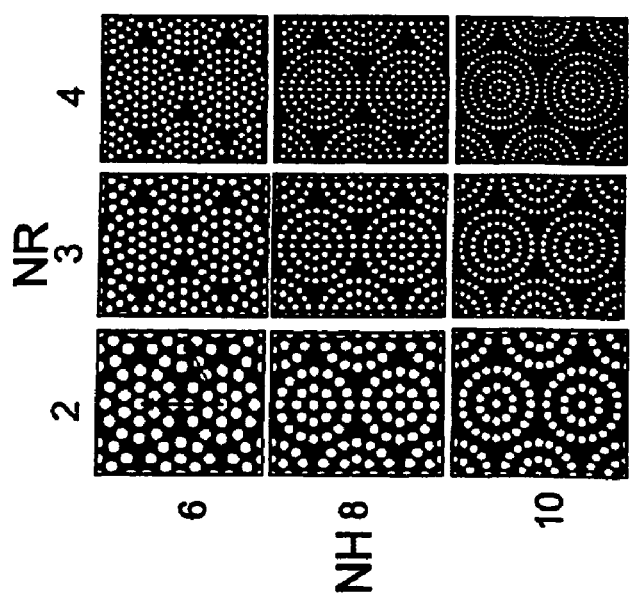

FIG. 9 shows numerical calculations for LED 100 having different ring patterns (complex periodic patterns). The number of holes in the first ring surrounding the central hole is different (six, eight or 10) for the different ring patterns. The data shown in FIG. 9 are calculated using the parameters given for the LED 100 shown in FIG. 1, except that the emitted light has a peak wavelength of 450 nm. The numerical calculations represented in FIG. 9 show the extraction efficiency of LED 100 as the number of ring patterns per unit cell that is repeated across a unit cell is varied from two to four. The enhancement in light extraction, the methodology for conducting the corresponding numerical calculation, and the physical explanation of the enhanced light extraction for a light-emitting device having the pattern shown in FIG. 9 is generally the same as described above.

Figure 10:
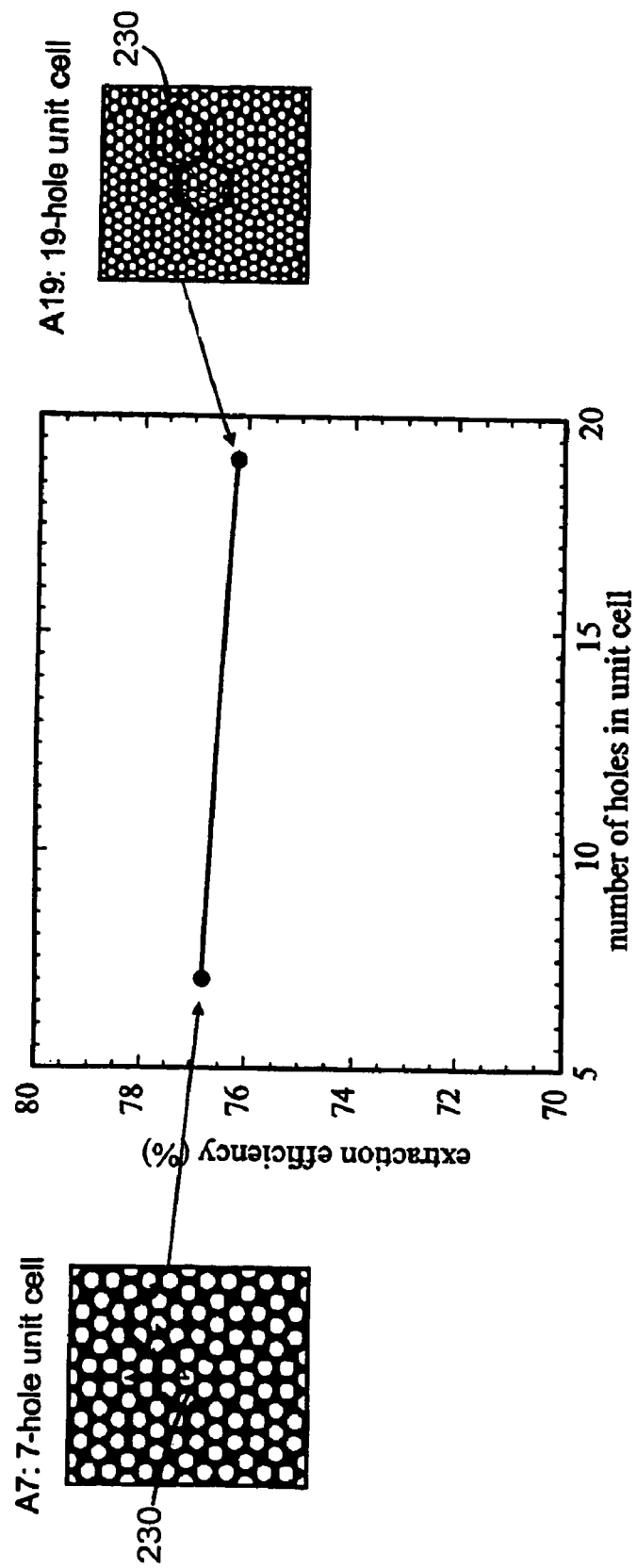
FIG. 10 is a graph of an extraction efficiency of LEDs with different surface patterns.

FIG. 10 shows numerical calculations for LED 100 having an Archimidean pattern. The Archimedean pattern A7 consists of hexagonal unit cells 230 of 7 equally-spaced holes with a nearest neighbor distance of a. Within a unit cell 230, six holes are arranged in the shape of a regular hexagon and the seventh hole is located at the center of the hexagon. The hexagonal unit cells 230 then fit together along their edges with a center-to-center spacing between the unit cells of a'=a* $(1+\sqrt{3})$ to pattern the entire surface of the LED. This is known as an A7 tiling, because 7 holes make up the unit cell. Similarly, the Archimidean tiling A19 consists of 19 equally-spaced holes with a NND of a. The holes are arranged in the form of an inner hexagon of seven holes, and outer hexagon of 12 holes, and a central hole within the inner hexagon. The hexagonal unit cells 230 then fit together along their edges with a center-to-center spacing between the unit cells of a'=a* $(3+\sqrt{3})$ to pattern the entire surface of the LED. The enhancement in light extraction, the methodology for conducting the corresponding numerical calculation, and the physical explanation of the enhanced light extraction for a light-emitting device having the pattern shown in FIG. 10 is generally the same as described above. As shown in FIG. 10 the extraction efficiency for A7 and A19 is about 77%. The data shown in FIG. 10 are calculated using the parameters given for the LED 100 shown in FIG. 1, except that the emitted light has a peak wavelength of 450 and except that the NND is defined as the distance between openings within an individual cell.

Figure 11:
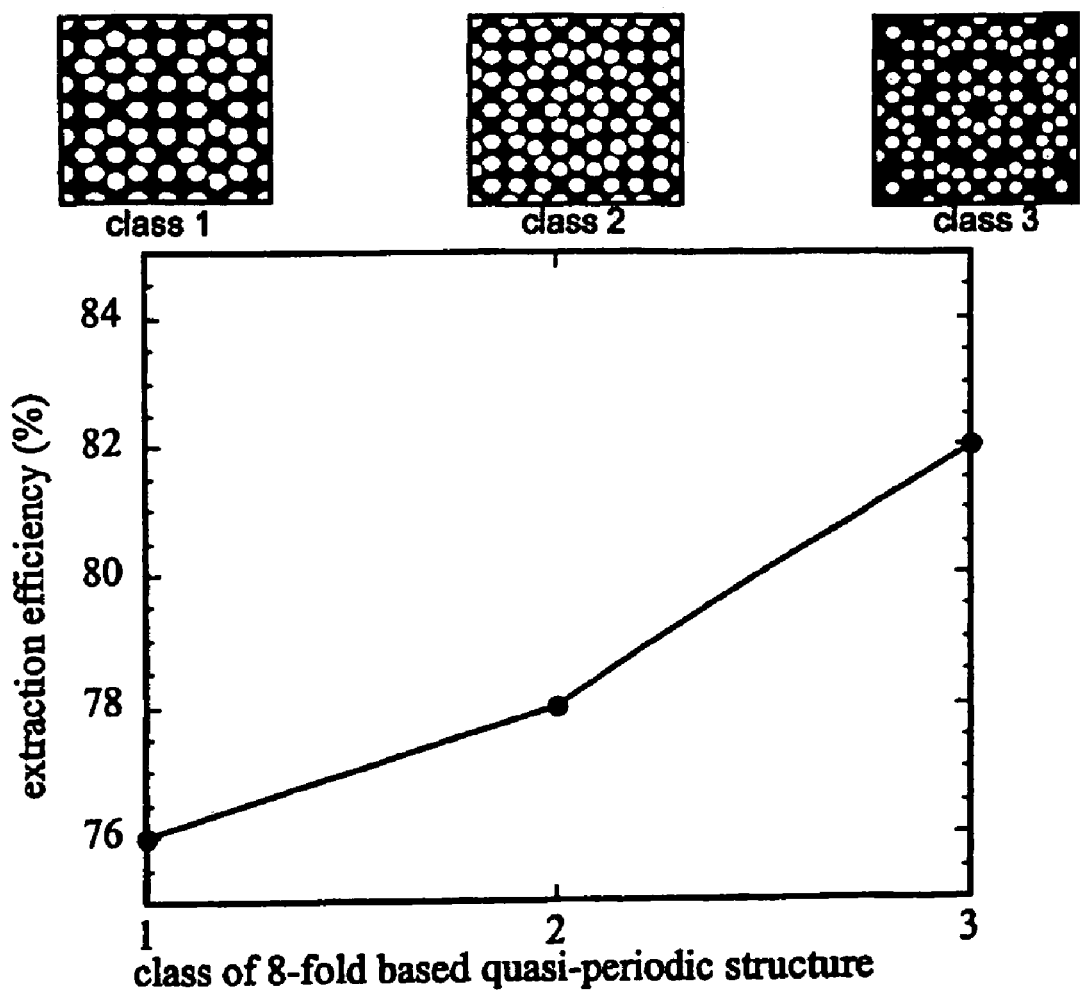
FIG. 11 is a graph of an extraction efficiency of LEDs with different surface patterns.

FIG. 11 shows numerical calculation data for LED 100 having a quasicrystalline pattern. Quasicrystalline patterns are described, for example, in M. Senechal, *Quasicrystals and Geometry* (Cambridge University Press, Cambridge, England 1996), which is hereby incorporated by reference. The numerical calculations show the behavior of the extraction efficiency as the class of 8-fold based quasi-periodic structure is varied. It is believed that quasicrystalline patterns exhibit high extraction efficiency due to high degree of in-plane rotational symmetries allowed by such structures. The enhancement in light extraction, the methodology for conducting the corresponding numerical calculation, and the physical explanation of the enhanced light extraction for a light-emitting device having the pattern shown in FIG. 11 is generally the same as described above. Results from FDTD calculations shown in FIG. 11 indicate that the extraction efficiency of quasicrystalline structures reaches about 82%. The data shown in FIG. 11 are calculated using the parameters given for the LED 100 shown in FIG. 1, except that the emitted light has a peak wavelength of 450 and except that the NND is defined as the distance between openings within an individual cell.

While certain examples of patterns have been described herein, it is believed that other patterns can also enhance the light extraction from LED 100 if the patterns satisfy the basic principles discussed above. For example, it is believed that adding detuning to quasicrystalline or complex periodic structures can increase extraction efficiency.

In some embodiments, at least about 45% (e.g., at least about 50%, at least about 55%, at least about 60%, at least about 70%, at least about 80%, at least about 90%, at least about 95%) of the total amount of light generated by light-generating region 130 that emerges from LED 100 emerges via surface 110.

In certain embodiments, the cross-sectional area of LED 100 can be relatively large, while still exhibiting efficient light extraction from LED 100. For example, one or more edges of LED 100 can be at least about one millimeter (e.g., at least about 1.5 millimeters, at least about two millimeters, at least about 2.5 millimeters, at least about three millimeters), and at least about 45% (e.g., at least about 50%, at least about 55%, at least about 60%, at least about 70%, at least about 80%, at least about 90%, at least about 95%) of the total amount of light generated by light-generating region 130 that emerges from LED 100 emerges via surface 110. This can allow for an LED to have a relatively large cross-section (e.g., at least about one millimeter by at least about one millimeter) while exhibiting good power conversion efficiency.

In some embodiments, the extraction efficiency of an LED having the design of LED 100 is substantially independent of the length of the edge of the LED. For example, the difference between the extraction efficiency of an LED having the design of LED 100 and one or more edges having a length of about 0.25 millimeter and the extraction efficiency of LED having the design of LED 100 and one or more edges having a length of one millimeter can vary by less than about 10% (e.g., less than about 8%, less than about 5%, less than about 3%). As referred to herein, the extraction efficiency of an LED is the ratio of the light emitted by the LED to the amount of light generated by the device (which can be measured in terms of energy or photons). This can allow for an LED to have a relatively large cross-section (e.g., at least about one millimeter by at least about one millimeter) while exhibiting good power conversion efficiency.

In certain embodiments, the quantum efficiency of an LED having the design of LED 100 is substantially independent of the length of the edge of the LED. For example, the difference between the quantum efficiency of an LED having the design of LED 100 and one or more edges having a length of about 0.25 millimeter and the quantum efficiency of LED having the design of LED 100 and one or more edges having a length of one millimeter can vary by less than about 10% (e.g., less than about 8%, less than about 5%, less than about 3%). As referred to herein, the quantum efficiency of an LED is the ratio of the number of photons generated by the LED to the number of electron-hole recombinations that occur in the LED. This can allow for an LED to have a relatively large cross-section (e.g., at least about one millimeter by at least about one millimeter) while exhibiting good performance.

In some embodiments, the wall plug efficiency of an LED having the design of LED 100 is substantially independent of the length of the edge of the LED. For example, the difference between the wall plug efficiency of an LED having the design of LED 100 and one or more edges having a length of about 0.25 millimeter and the wall plug efficiency of LED having the design of LED 100 and one or more edges having a length of one millimeter can vary by less than about 10% (e.g., less than about 8%, less than about 5%, less than about 3%). As referred to herein, the wall plug efficiency of an LED is the product of the injection efficiency of the LED (the ratio of the numbers of carriers injected into the device to the number of carriers that recombine in the light-generating region of the device), the radiative efficiency of the LED (the ratio of electron-hole recombinations that result in a radiative event to the total number of electron-hole recombinations), and the extraction efficiency of the LED (the ratio of photons that are extracted from the LED to the total number of photons created). This can allow for an LED to have a relatively large cross-section (e.g., at least about one millimeter by at least about one millimeter) while exhibiting good performance.

Figure 12:
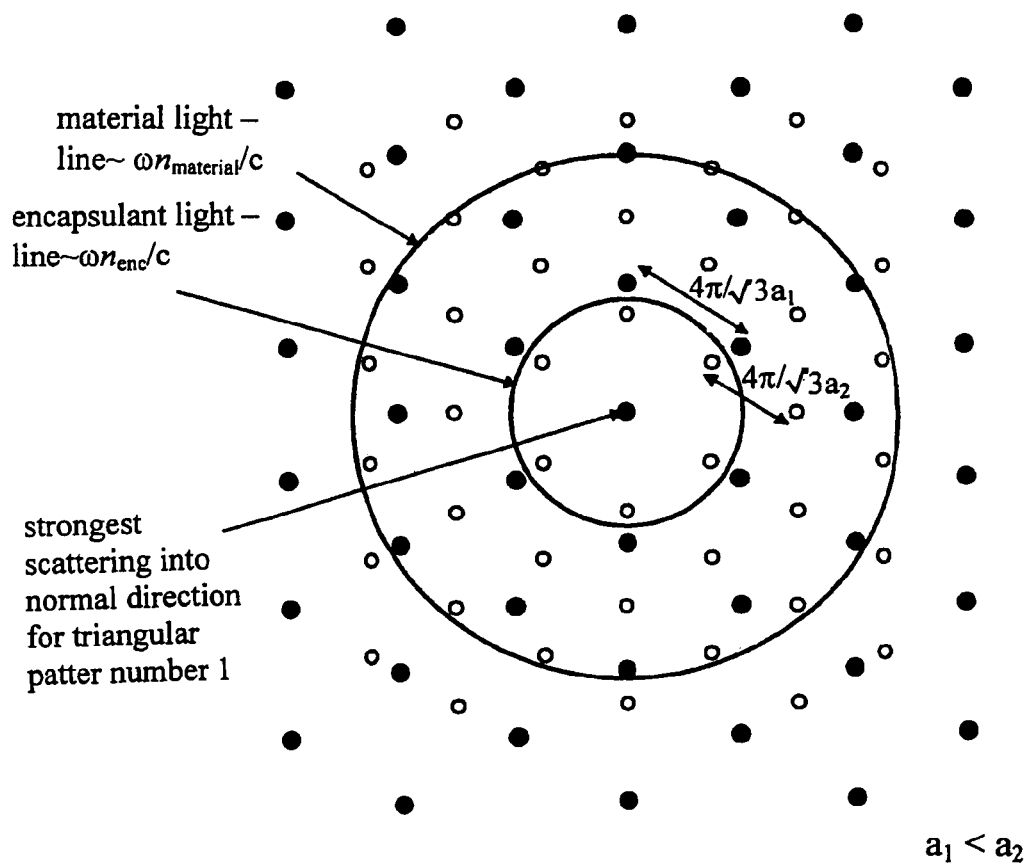
FIG. 12 is a schematic representation of the Fourier transformation two LEDs having different patterned surfaces compared with the radiation emission spectrum of the LEDs.
Figure 13:
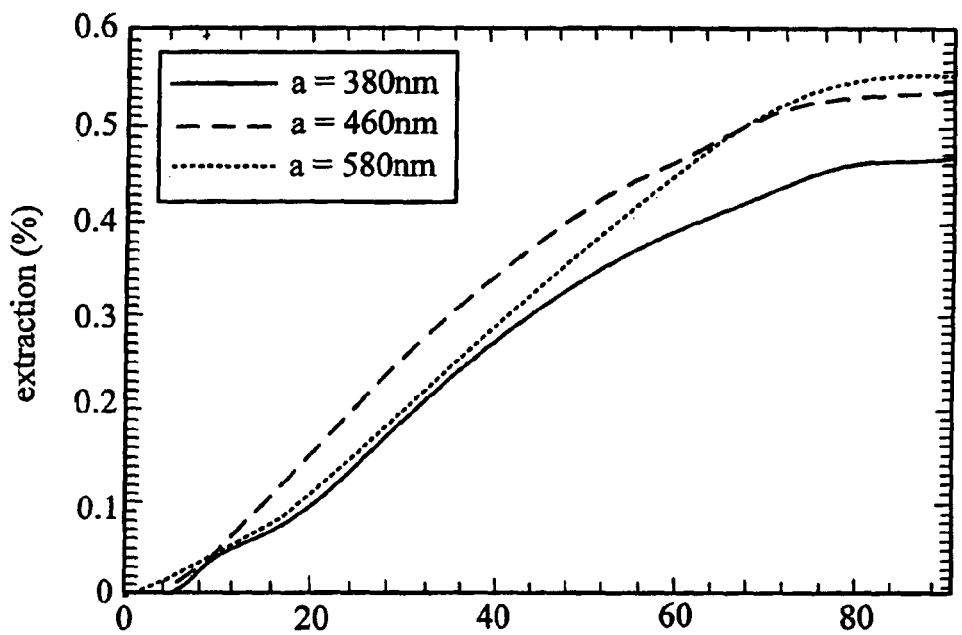
FIG. 13 is a graph of an extraction efficiency of LEDs having different surface patterns as a function of angle.

In some embodiments, it may be desirable to manipulate the angular distribution of light that emerges from LED 100 via surface 110. To increase extraction efficiency into a given solid angle (e.g., into a solid angle around the direction normal to surface 110) we examine the Fourier transform of the dielectric function that varies spatially according to pattern 150 (as described earlier). FIG. 12 shows the Fourier transform construction for two ideal triangular lattices of different lattice constant. To increase the extraction efficiency, we seek to increase the number of G points within the encapsulant light line and scattering strengths of G points ($\in_G$) within the material light line. This would imply increasing the NND so as to achieve the effect depicted in FIG. 5. However, here we are concerned with increasing the extraction efficiency into a solid angle centered around the normal direction. Therefore, we would also like to limit the introduction of higher order G points by reducing the radius of the encapsulant light line, such that the magnitude of $G > (\omega(n_e))/c$. We can see that by decreasing the index of refraction of the encapsulant (the bare minimum of which is removing the encapsulant all together) we allow larger NND and therefore increase the number of G points within the material light line that are available to contribute to extraction in the normal direction ($F_{k=0}$) while simultaneously avoiding diffraction into higher order (oblique angles) in the encapsulant. The above described trends are depicted in FIG. 13 which shows extraction efficiency into a solid angle (given by the collection half-angle in the diagram). The data shown in FIG. 13 are calculated using the parameters given for the LED 100 shown in FIG. 1, except that the emitted light has a peak wavelength of 530 nm and a bandwidth of 34 nm, the index of refraction of the encapsulant was 1.0, the thickness of the p-doped layer was 160 nm, the light generating layer was 30 nm thick, the NND (a) for the three curves is shown on FIG. 13, and the depth, hole diameter, and n-doped layer thickness scaled with a, as 1.27a, 0.72a, and 1.27a+40 nm, respectively. As the lattice constant is increased, the extraction efficiency at narrow angles increases as well as the overall extraction efficiency into all angles. However, for even larger lattice constant, diffraction into higher order modes in the encapsulant limits the extraction efficiency at narrow angles even though the overall extraction efficiency increases into all angles. For a lattice constant of 460 nm, we calculate greater than 25% extraction efficiency into a collection half-angle of 30°. That is, about half of the extracted light is collected within only about 13.4% of the upper hemisphere of solid angle demonstrating the collimation effect of the pattern. It is believed that any pattern that increases the number of G points within the material light line while limiting the number of G points within the encapsulant light line to only the G points at k=0 can improve the extraction efficiency into a solid angle centered around the normal direction.

The approach is especially applicable for reducing the source etendue which is believed to often be proportional to $n^2$, where n is the index of refraction of the surrounding material (e.g., the encapsulant). It is therefore believed that reducing the index of refraction of the encapsulating layer for LED 100 can lead to more collimated emission, a lower source etendue, and therefore to a higher surface brightness (here defined as the total lumens extracted into the etendue of the source). In some embodiments then, using an encapsulant of air will reduce the source etendue while increasing extraction efficiency into a given collection angle centered around the normal direction.

In certain embodiments, when light generated by region 130 emerges from LED 100 via surface 110, the distribution of light is more collimated than a lambertian distribution. For example, in some embodiments, when light generated by region 130 emerges from LED 100 via surface 110, at least about 40% (e.g., at least about 50%, at least about 70%, at least about 90%) of the light emerging via the surface of the dielectric layer emerges within at most about 30° (e.g., at most about 25°, at most about 20°, at most about 15°) of an angle normal to surface 110.

The ability to extract a relatively high percentage of light from a desired angle alone or coupled with a relatively high light extraction can allow for a relatively high density of LEDs to be prepared on a given wafer. For example, in some embodiments, a wafer has at least about five LEDs (e.g., at least about 25 LEDs, at least about 50 LEDs) per square centimeter.

Figure 14:
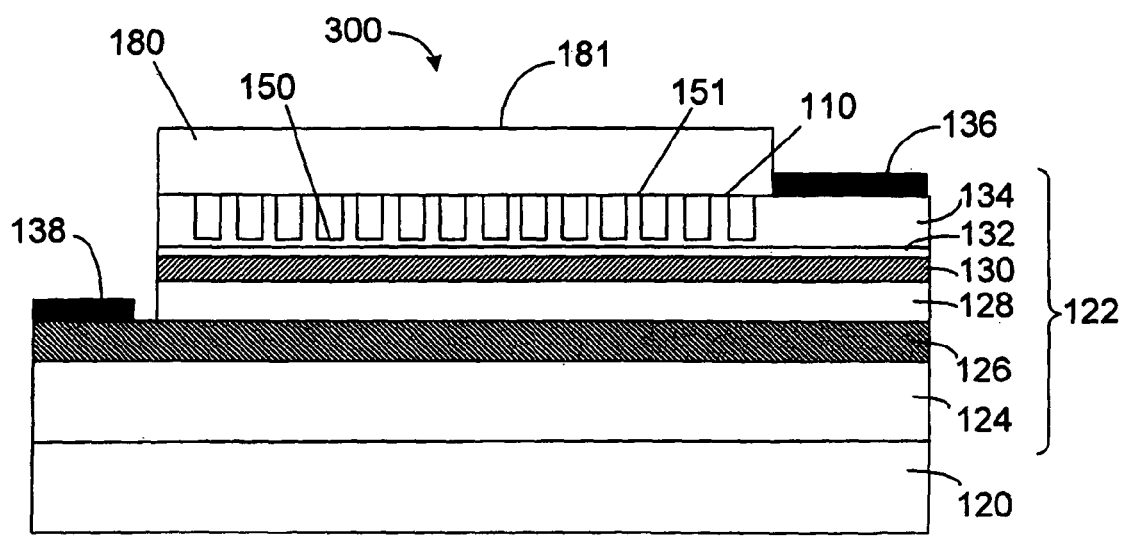
FIG. 14 is a side view of an LED with a patterned surface and a phosphor layer on the patterned surface.

In some embodiments, it may be desirable to modify the wavelength(s) of light that emerge(s) from a packaged LED 100 relative to the wavelength(s) of light generated by light-generating region 130. For example, as shown in FIG. 14, an LED 300 having a layer containing a phosphor material 180 can be disposed on surface 110. The phosphor material can interact with light at the wavelength(s) generated by region 130 to provide light at desired wavelength(s). In some embodiments, it may be desirable for the light that emerges from packaged LED 100 to be substantially white light. In such embodiments, the phosphor material in layer 180 can be formed of, for example, a $(Y,Gd)(Al,Ga)G:Ce^{3+}$ or "YAG" (yttrium, aluminum, garnet) phosphor. When pumped by blue light emitted from the light-generating region 130, the phosphor material in layer 180 can be activated and emit light (e.g., isotropically) with a broad spectrum centered around yellow wavelengths. A viewer of the total light spectrum emerging from packaged LED 100 sees the yellow phosphor broad emission spectrum and the blue InGaN narrow emission spectrum and typically mixes the two spectra to perceive white.

In certain embodiments, layer 180 can be substantially uniformly disposed on surface 110. For example, the distance between the top 151 of pattern 150 and the top 181 of layer 180 can vary by less than about 20% (e.g., less than about 10%, less than about 5%, less than about 2%) across surface 110.

In general, the thickness of layer 180 is small compared to the cross-sectional dimensions of surface 130 of LED 100, which are typically about one millimeter (mm) by one mm. Because layer 180 is substantially uniformly deposited on surface 110, the phosphor material in layer 180 can be substantially uniformly pumped by light emerging via surface 110. The phosphor layer 180 is relatively thin compared to the dimensions of the surface 110 of the LED 100, such that light emitted by the light-generating region 130 is converted into lower wavelength light within the phosphor layer 180 approximately uniformly over the entire surface 110 of LED 100. Thus, the relatively thin, uniform phosphor layer 180 produces a uniform spectrum of white light emitted from the LED 100 as a function of position on surface 110.

In general, LED 100 can be fabricated as desired. Typically, fabrication of LED 100 involves various deposition, laser processing, lithography, and etching steps.

Figure 15:
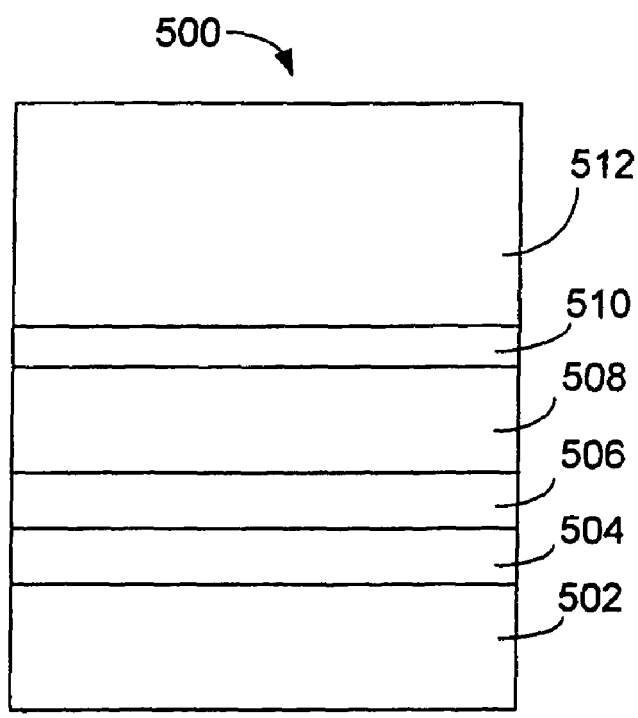
FIG. 15 is a side view of a epitaxial layer precursor to an LED with a patterned surface.

Referring to FIG. 15, a LED wafer 500 containing an LED layer stack of material deposited on a sapphire substrate is readily available and can be purchased from a commercial vendor. On the sapphire substrate 502 are disposed, consecutively, a buffer layer 504, an n-doped Si:GaN layer 506, an AlGaN/GaN heterojunction or superlattice that provides a current spreading layer 508, an InGaN/GaN multi-quantum well light-generating region 510, and a p-doped Mg:GaN layer 512. The commercially available LED wafer is about 2-3 inches in diameter and multiple LED dice can be cut from the wafer to form individual devices after the wafer has been processed. Before dicing the wafer, a number of wafer scale processing steps are used to position the p-doped layer 128 on the same side of the light-generating region 130 as the mirror layer 126.

Figure 16:
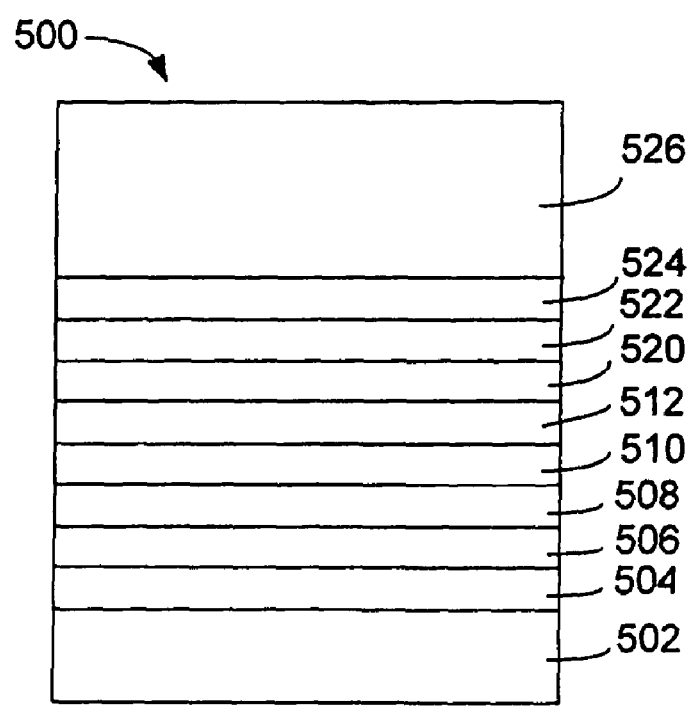
FIG. 16 is a side view of a epitaxial layer precursor to an LED with a patterned surface.

Referring to FIG. 16, a relatively thin nickel layer 520 is deposited (e.g., using electron-beam evaporation) on p-doped layer 512 to form a p-type ohmic contact to p-doped layer 512. A silver layer 522 is deposited (e.g., using electron-beam evaporation) on nickel layer 520. A relatively thick nickel layer 524 is deposited on silver layer 522 (e.g., using electron-beam evaporation). Layer 524 can act as diffusion barrier to reduce the diffusion of contaminants into silver layer 522. A gold layer 526 is deposited on nickel layer 524 (e.g., using resistance evaporation). Wafer 500 is then annealed at a temperature between 400 and 600 degrees Celsius for between 30 and 300 seconds in a nitrogen, oxygen, air, or forming gas to achieve an ohmic contact.

Figure 17:
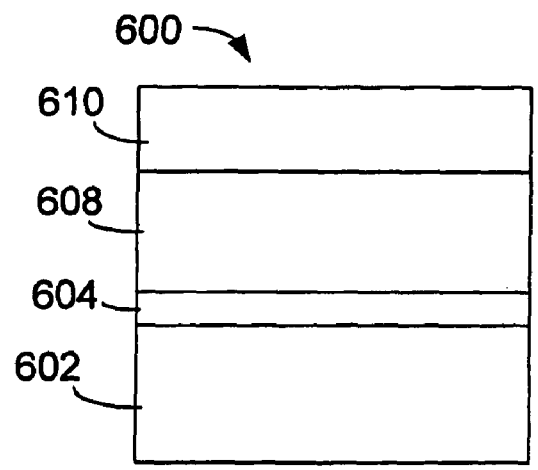
FIG. 17 is a side view of a epitaxial layer precursor to an LED with a patterned surface.

Referring to FIG. 17, a submount wafer 600 is prepared by depositing on a p-doped silicon wafer 602, consecutively (e.g., using electron-beam evaporation) an aluminum contact layer 604. A gold layer 608 is deposited (e.g., using thermal evaporation) onto layer 604, and a AuSn bonding layer 610 is deposited (e.g., using thermal evaporation) onto layer 608. Submount wafer 600 is annealed at a temperature between 350 and 500 degrees Celsius for between 30 and 300 seconds in a nitrogen, oxygen, air, or forming gas to achieve an ohmic contact.

Wafer 500 and 600 are bonded together by bringing the layer 526 into contact with layer 610 of the submount wafer 600 (e.g., using a thermal-mechanical press) using pressures from 0 to 0.5 MPa and temperatures ranging from 200-400 degrees Celsius. Layer 510 and layer 610 form a eutectic bond. The combined wafer sandwich is cooled and the bonded sandwich is removed from the press.

After bonding, substrate 502 is removed from the combined structure by a laser liftoff process. Laser liftoff processes are disclosed, for example, in U.S. Pat. Nos. 6,420,242 and 6,071,795, which are hereby incorporated by reference. In some embodiments, a 248 nm laser beam is shined through substrate 502 to locally heat n-doped Si:GaN layer 506 near its interface with sapphire substrate 502, decomposing a sublayer of n-doped layer 506. The wafer sandwich is then heated to above the melting point of gallium, at which point sapphire substrate 502 is removed from the sandwich by applying a lateral force to it (e.g., using a cotton swab). The exposed GaN surface is then cleaned (e.g., using a hydrochloric acid bath) to remove liquid gallium from the surface. Often, when sapphire substrate 502 is removed from the GaN epitaxial layer stack, strain that was present in the stack (e.g., due to the lattice mismatch between substrate 502 and the stack) is removed from the stack. This can allow the stack to relax from a warped or bowed shape it may have had when bonded to substrate 502, and to assume a relatively flat shape on the exposed surface of n-doped layer 506. The coefficient of thermal expansion is considered when choosing the submount to avoid cracking in the laser liftoff process. In addition, cracking can be reduced during laser-liftoff by substantially overlapping fields in the step and repeat process.

Figure 18:
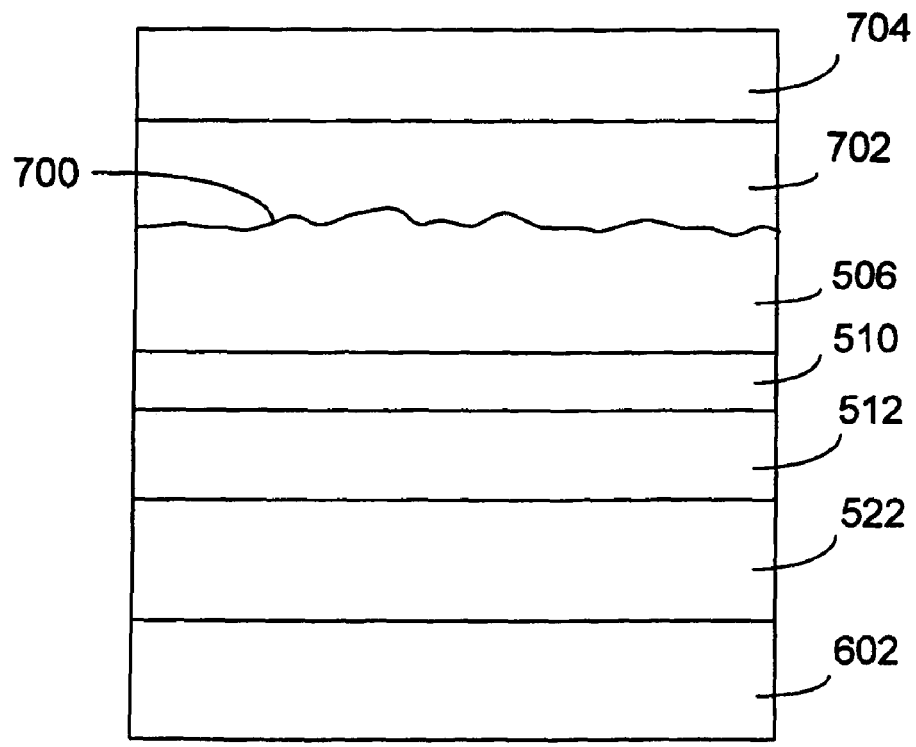
FIG. 18 is a side view of a epitaxial layer precursor to an LED with a patterned surface.
Figure 19:
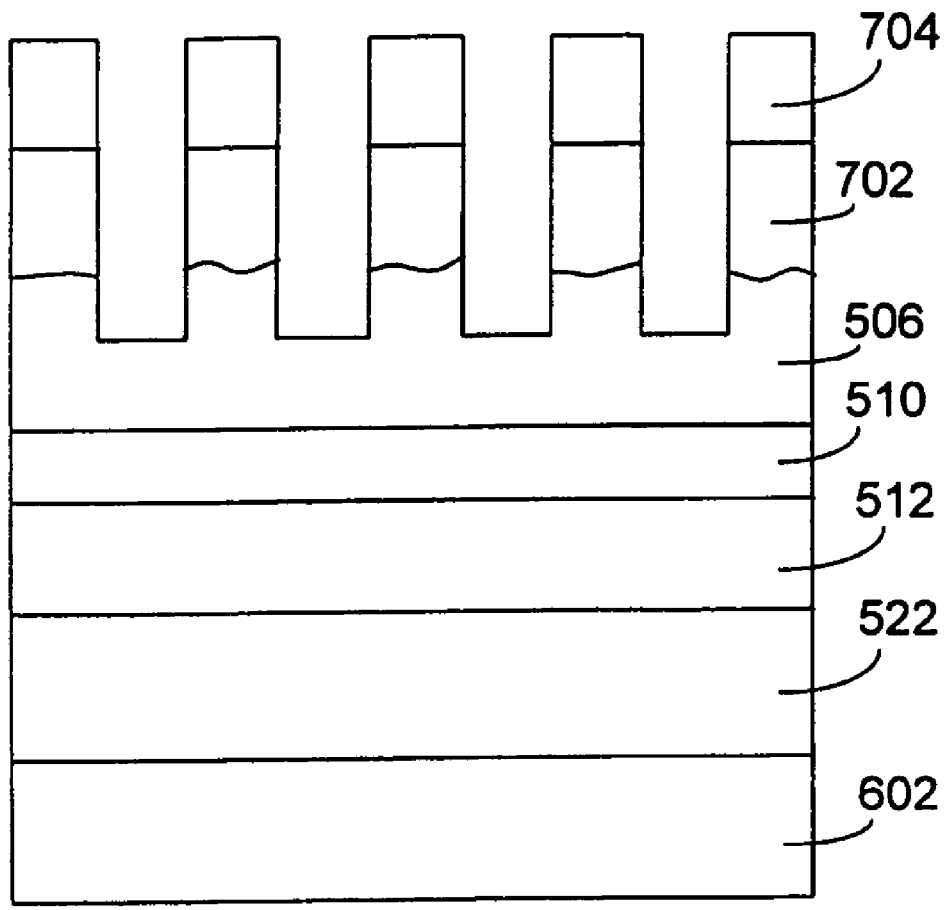
FIG. 19 is a side view of a epitaxial layer precursor to an LED with a patterned surface.

Referring to FIG. 18, the exposed surface of n-doped Si:GaN layer 506 is etched back (e.g., using a reactive ion etching process) to achieve a desired thickness for the layer to be used in the final device (FIG. 19). After etching, the surface of the etched GaN layer 506 has a roughened surface texture 700 due to the etching. Roughened surface 700 can be planarized and thinned (e.g., using a chemical-mechanical process) to achieve a final thickness for layer 506 and surface smoothness of less than about 5 nm root mean square (rms). Alternatively, roughened surface 700 can be maintained in order to aid in increasing the extraction efficiency of the device by introducing a locally non-planar interface to the device 100. The roughened surface increases the probability, with respect to a microscopically smooth surface, that a light ray that strikes surface 700 multiple times will eventually strike the surface at an angle that less than the critical angle given by Snell's law and will be extracted through the surface 700.

After etching, to prepare a dielectric function pattern in the n-doped layer 506, first a planarization layer 702 of a material (e.g., a polymer) is disposed (e.g., using spin-coating) onto n-doped GaN layer 506 and a resist layer 704 is disposed (e.g., spin-coated) onto planarization layer 702. The pattern that forms the photonic lattice in the LED is then created in n-doped layer 506 by a nanoimprint lithography and etching process. First, a mold that defines a portion of the desired pattern is pressed into the resist layer 704 and stepped across the entire surface of the wafer in a portion-by-portion manner to print the features of the pattern 150 and leaving regions for depositing n-contacts later on in the process flow. Preferably, the surface of n-doped layer 506 is substantially flat during this portion of the process. X-ray lithography or deep ultraviolet lithography, for example, can also be used to create the pattern in resist layer 704. As an alternative to depositing a resist on the wafer and creating a pattern in the resist on the wafer, a predeposited etch mask can be laid down on the surface of layer 506.

Patterned layer 704 is used as a mask to transfer the pattern into the planarization layer 702 (e.g., using a reactive-ion etching process). Planarization layer is subsequently used as a mask to transfer the pattern into the n-doped layer 506. Following etching of GaN layer 506, the planarization layer is removed (e.g., using an oxygen-based reactive ion etch).

After the pattern has been transferred to n-doped layer 506, a layer of phosphor material can optionally be disposed (e.g., spin-coated) onto the patterned surface of n-doped layer 506. In some embodiments, the phosphor can conformally coat the patterned surface (coat with substantially no voids present along the bottoms and sidewalls of the openings in the patterned surface). Alternatively, a layer of encapsulant material can be disposed on the surface of patterned n-doped layer 506 (e.g. by CVD, sputtering, suspension by liquid binder that is subsequently evaporated). In some embodiments, the encapsulant can contain one or more phosphor materials. In some embodiments, the phosphor can be compressed to achieve thickness uniformity less that 20%, less than 15%, less than 10%, less than 5%, or less than 2% of the average thickness of the phosphor. In some embodiments, the phosphor-containing encapsulant can conformally coat the patterned surface.

After the dielectric function pattern has been created in the n-doped layer 506, individual LED dice can be cut from the wafer. Once wafer processing and wafer testing is complete, individual LED dice are separated and prepared for packaging and testing. A sidewall passivation step and/or a pre-separation deep mesa etching step may be used to reduce potential damage to the electrical and/or optical properties of the patterned LED incurred during wafer cutting. The individual LEDs can be any size up to the size of the wafer itself, but individual LEDs are typically square or rectangular, with sides having a length between about 0.5 mm to 5 mm. To create the dice, standard photolithography is used to define the location of contact pads on the wafer for energizing the device, and ohmic contacts are evaporated (e.g. using electron beam evaporation) onto the desired locations.

If an LED die is packaged, the package should generally be capable of facilitating light collection while also providing mechanical and environmental protection of the die. For example, a transparent cover can be packaged on the LED die to protect the patterned surface of the 506 when an encapsulant is not used. The cover slip is attached to supports 142 using a glassy frit that is melted in a furnace. The opposite ends of the supports are connected using a cap weld or an epoxy for example. Supports are typically Ni-plated to facilitate welding to an Au plated surface of the package. It believed that the absence of an encapsulant layer allows higher tolerable power loads per unit area in the patterned surface LED 100. Degradation of the encapsulant can be a common failure mechanism for standard LEDs and is avoided not using an encapsulant layer.

Because the LEDs are cut from a large area flat wafer, their light output per area does not decrease with area. Also, because the cross section of an individual LEDs cut from a wafer is only slightly larger than the light-emitting surface area of the LED, many individual, and separately addressable LEDs can be packed closely together in an array. If one LED does not function (e.g., due to a large defect), then it does not significant diminish the performance of the array because the individual devices are closely packed.

While certain embodiments have been described, other embodiments are possible.

As an example, while certain thickness for a light-emitting device and associated layers are discussed above, other thicknesses are also possible. In general, the light-emitting device can have any desired thickness, and the individual layers within the light-emitting device can have any desired thickness. Typically, the thicknesses of the layers within multi-layer stack 122 are chosen so as to increase the spatial overlap of the optical modes with light-generating region 130, to increase the output from light generated in region 130. Exemplary thicknesses for certain layers in a light-emitting device include the following. In some embodiments, layer 134 can have a thickness of at least about 100 nm (e.g., at least about 200 nm, at least about 300 nm, at least about 400 nm, at least about 500 nm) and/or at most about 10 microns (e.g., at most about five microns, at most about three microns, at most about one micron). In certain embodiments, layer 128 has a thickness of at least about 10 nm (e.g., at least about 25 nm, at least about 40 nm) and/or at most about one micron (e.g., at most about 500 nm, at most about 100 nm). In some embodiments, layer 126 has a thickness of at least about 10 nm (e.g., at least about 50 nm, at least about 100 nm) and/or at most about one micron (e.g., at most about 500 nm, at most about 250 nm). In certain embodiments, light-generating region 130 has a thickness of at least about 10 nm (e.g., at least about 25 nm, at least about 50 nm, at least about 100 nm) and/or at most about 500 nm (e.g., at most about 250 nm, at most about 150 nm).

As an example, while a light-emitting diode has been described, other light-emitting devices having the above-described features (e.g., patterns, processes) can be used. Such light-emitting devices include lasers and optical amplifiers.

As another example, while current spreading layer 132 has been described as a separate layer from n-doped layer 134, in some embodiments, a current spreading layer can be integral with (e.g., a portion of) layer 134. In such embodiments, the current spreading layer can be a relatively highly n-doped portion of layer 134 or a heterojunction between (e.g. AlGaN/GaN) to form a 2D electron gas.

As a further example, while certain semiconductor materials have been described, other semiconductor materials can also be used. In general, any semiconductor materials (e.g., III-V semiconductor materials, organic semiconductor materials, silicon) can be used that can be used in a light-emitting device. Examples of other light-generating materials include InGaAsP, AlInGaN, AlGaAs, InGaAlP. Organic light-emitting materials include small molecules such as aluminum tris-8-hydroxyquinoline ($Alq_3$) and conjugated polymers such as poly[2-methoxy-5-(2-ethylhexyloxy)-1,4-vinylenephenylene] or MEH-PPV.

As an additional example, while large area LEDs have been described, the LEDs can also be small area LEDs (e.g., LEDs smaller than the standard about 300 microns on edge).

As another example, while a dielectric function that varies spatially according to a pattern has been described in which the pattern is formed of holes, the pattern can also be formed in other ways. For example, a pattern can be formed continuous veins and/or discontinuous veins in the appropriate layer. Further, the pattern in varying dielectric function can be achieved without using holes or veins. For example, materials having different dielectric functions can be patterned in the appropriate layer. Combinations of such patterns can also be used.

As a further example, while layer 126 has been described as being formed of silver, other materials can also be used. In some embodiments, layer 126 is formed of a material that can reflect at least about 50% of light generated by the light-generating region that impinges on the layer of reflective material, the layer of reflective material being between the support and the multi-layer stack of materials. Examples of such materials include distributed Bragg reflector stacks and various metals and alloys, such as aluminum and aluminum-containing alloys.

As another example, support 120 can be formed of a variety of materials. Examples of materials from which support 120 can be formed include copper, copper-tungsten, aluminum nitride, silicon carbide, beryllium-oxide, diamonds, TEC and aluminum.

As an additional example, while layer 126 has been described as being formed of a heat sink material, in some embodiments, a light-emitting device can include a separate layer (e.g., disposed between layer 126 and submount 120) that serves as a heat sink. In such embodiments, layer 126 may or may not be formed of a material that can serve as a heat sink.

Figure 20:
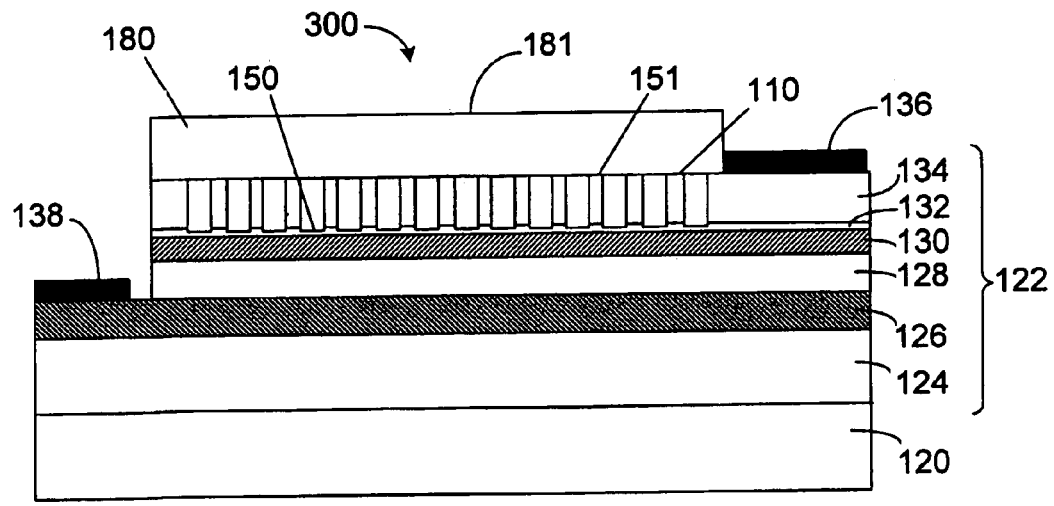
FIG. 20 is a side view of an LED with a patterned surface.
Figure 21:
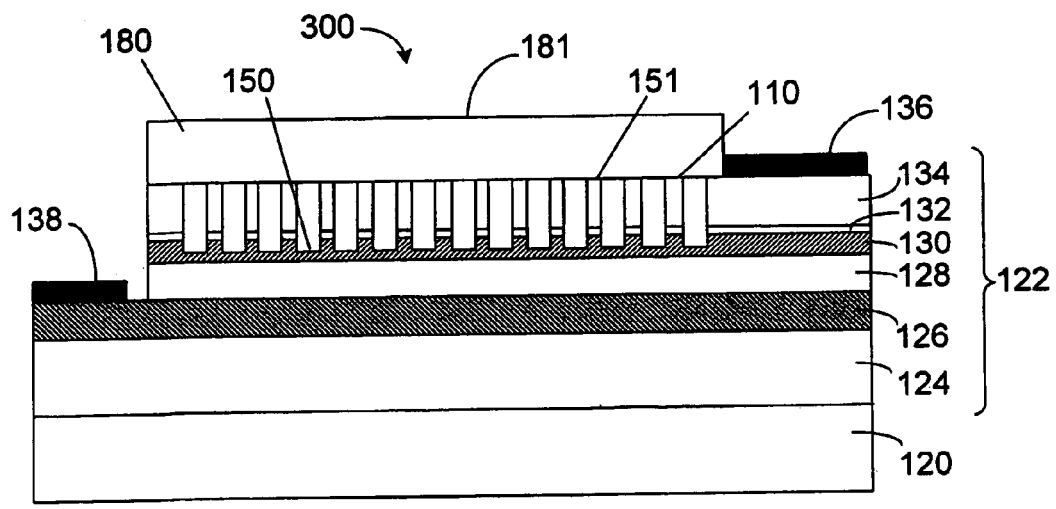
FIG. 21 is a side view of an LED with a patterned surface.
Figure 22:
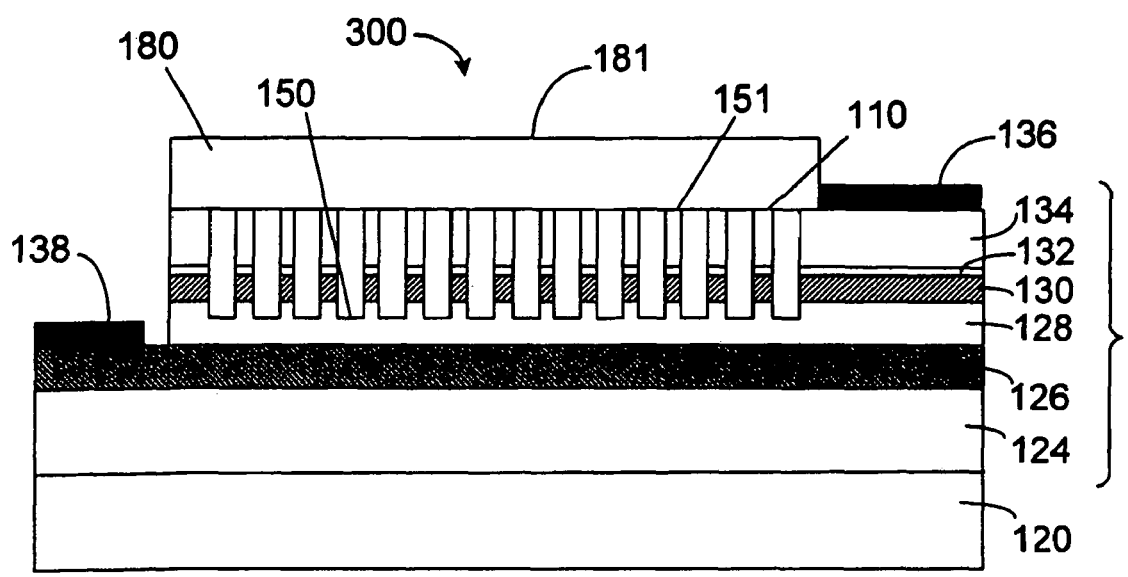
FIG. 22 is a side view of an LED with a patterned surface.

As a further example, while the varying pattern in dielectric function has been described as extending into n-doped layer 134 only (which can substantially reduce the likelihood of surface recombination carrier losses) in addition to making use of the entire light-generating region, in some embodiments, the varying pattern in dielectric function can extend beyond n-doped layer (e.g., into current spreading layer 132, light-generating region 130, and/or p-doped layer 128). FIG. 20 shows an embodiment in which the varying pattern in dielectric function extends into layer 132. FIG. 21 shows an embodiment in which the varying pattern in dielectric function extends into layer 130. FIG. 22 shows an embodiment in which the varying pattern in dielectric function extends into layer 128.

As another example, while embodiments have been described in which air can be disposed between surface 110 can cover slip 140, in some embodiments materials other than, or in an addition to, air can be disposed between surface 110 and cover slip 140. Generally, such materials have an index of refraction of at least about one and less than about 1.5 (e.g., less than about 1.4, less than about 1.3, less than about 1.2, less than about 1.1). Examples of such materials include nitrogen, air, or some higher thermal conductivity gas. In such embodiments, surface 110 may or may not be patterned. For example, surface 110 may be non-patterned but may be roughened (i.e., having randomly distributed features of various sizes and shapes less than $\lambda/5$).

In some embodiments, a light-emitting device can include a layer of a phosphor material coated on surface 110, cover layer 140 and supports 142.

In certain embodiments, a light-emitting device can include a cover layer 140 that has a phosphor material disposed therein. In such embodiments, surface 110 may or may not be patterned.

In an alternative implementation, the light emitted by the light-generating region 130 is UV (or violet, or blue) and the phosphor layer 180 includes a mixture of a red phosphor material (e.g., $L_2O_2S:Eu^{3+}$), a green phosphor material (e.g, ZnS:Cu,Al,Mn), and blue phosphor material (e.g, $(Sr,Ca,Ba,Mg)_{10}(PO_4)_6Cl:Eu^{2+}$).

Other embodiments are in the claims.

What is claimed is:
1. A light-emitting device, comprising:
a multi-layer stack of materials including a light-generating region and a first layer supported by the light-generating region, wherein:
a surface of the first layer is configured so that light generated by the light-generating region can emerge from the light-emitting device via the surface of the first layer; and
the surface has a dielectric function that varies spatially according to a nonperiodic pattern that is configured to increase light extraction from the device via the surface, the nonperiodic pattern is created by the configuration of a plurality of holes, wherein the holes are not encircled by other holes, wherein when viewed in a direction in which the holes extend from the surface into the first layer, the non-periodic pattern has no translational symmetry along the surface over a unit cell that has a length that is at least 50 times the peak wavelength of light generated by the light-generating region.

2. The light-emitting device of claim 1, wherein the nonperiodic pattern is selected from the group consisting of quasicrystalline patterns, Robinson patterns, and Amman patterns.

3. The light-emitting device of claim 1, wherein the multi-layer stack of materials comprises a multi-layer stack of semiconductor materials.

4. The light-emitting device of claim 3, wherein the first layer comprises a layer of n-doped semiconductor material, and the multi-layer stack further comprises a layer of p-doped semiconductor material.

5. The light-emitting device of claim 4, wherein the light-generating region is between the layer of n-doped semiconductor material and the layer of p-doped semiconductor material.

6. The light-emitting device of claim 5, further comprising a support that supports the multi-layer stack of materials.

7. The light-emitting device of claim 6, further comprising a layer of reflective material that is capable of reflecting at least about 50% of light generated by the light-generating region that impinges on the layer of reflective material, the layer of reflective material being between the support and the multi-layer stack of materials.

8. The light-emitting device of claim 7, wherein a distance between the layer of p-doped semiconductor material and the layer of reflective material is less than a distance between the layer of n-doped semiconductor material and the layer of reflective material.

9. The light-emitting device of claim 8, further comprising a p-ohmic contact layer between the layer of p-doped material and the layer of reflective material.

10. The light-emitting device of claim 1, further including a current-spreading layer between the first layer and the light-generating region.

11. The light-emitting device of claim 1, wherein the multi-layer stack of materials comprise semiconductor materials.

12. The light-emitting device of claim 11, wherein the semiconductor materials are selected from the group consisting of III-V semiconductor materials, organic semiconductor materials and silicon.

13. The light-emitting device of claim 1, wherein the pattern does not extend into the light-generating region.

14. The light-emitting device of claim 1, wherein the pattern does not extend beyond the first layer.

15. The light-emitting device of claim 1, wherein the pattern extends beyond the first layer.

16. The light-emitting device of claim 1, further comprising electrical contacts configured to inject current into the light-emitting device.

17. The light-emitting device of claim 16, wherein the electrical contacts are configured to vertically inject electrical current into the light-emitting device.

18. The light-emitting device of claim 1, wherein the pattern comprises a Penrose pattern.

19. The light-emitting device of claim 1, wherein the pattern is configured so that light emitted by the surface of the first layer has a spectrum of radiation modes, and the spectrum of radiation modes is substantially the same as a characteristic emission spectrum of the light-generating region.

20. The light-emitting device of claim 1, wherein the light-emitting device is selected from the group consisting of light-emitting diodes, lasers, optical amplifiers, and combinations thereof.

21. The light-emitting device of claim 1, wherein the light-emitting device comprises a light emitting diode.

22. The light-emitting device of claim 1, wherein the light-emitting device is selected from the group consisting of OLEDs, flat surface-emitting LEDs, HBLEDs, and combinations thereof.

23. The light-emitting device of claim 1, wherein the holes in the surface of the first layer have a size of less than about $\lambda/5$, where $\lambda$ is a wavelength of light that can be generated by the light-generating region and that can emerge from the light-emitting device via the surface of the first layer.

24. The light-emitting device of claim 1, wherein a majority of the holes have substantially the same size.

25. The light-emitting device of claim 1, wherein a majority of nearest neighbor distances between the holes are substantially the same.

26. The light-emitting device of claim 1, wherein the pattern has in-plane symmetry.

27. The light-emitting device of claim 1, wherein the pattern has in-plane rotational symmetry.

* * * * *